US012648401B2

(12) United States Patent
Iwasaki et al.

(10) Patent No.: US 12,648,401 B2
(45) Date of Patent: Jun. 2, 2026

(54) SUBSTRATE PROCESSING SYSTEM

(71) Applicant: SCREEN Holdings Co., Ltd., Kyoto (JP)

(72) Inventors: Akihiro Iwasaki, Kyoto (JP); Tsuyoshi Tomita, Kyoto (JP); Shinichi Taniguchi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 87 days.

(21) Appl. No.: 18/784,170

(22) Filed: Jul. 25, 2024

(65) Prior Publication Data

US 2025/0038028 A1      Jan. 30, 2025

(30) Foreign Application Priority Data

Jul. 26, 2023     (JP) ................................. 2023-121794

(51) Int. Cl.
*H10P 72/30*          (2026.01)
*H10P 72/00*          (2026.01)
*H10P 72/10*          (2026.01)

(52) U.S. Cl.
CPC ...... *H10P 72/3312* (2026.01); *H10P 72/0404* (2026.01); *H10P 72/0456* (2026.01); *H10P 72/14* (2026.01); *H10P 72/3211* (2026.01)

(58) Field of Classification Search
CPC .. H10P 72/3312; H10P 72/3211; H10P 72/14; H10P 72/0404
See application file for complete search history.

(56) References Cited

U.S. PATENT DOCUMENTS

| | | | |
|---|---|---|---|
| 2006/0137726 A1 | 6/2006 | Sano et al. | ...................... 134/61 |
| 2008/0166208 A1 | 7/2008 | Lester et al. | .................. 414/217 |
| 2018/0158701 A1 | 6/2018 | Hyakutake | |
| 2021/0111038 A1 | 4/2021 | Kanagawa et al. | |
| 2022/0172966 A1 | 6/2022 | Choi et al. | |

(Continued)

FOREIGN PATENT DOCUMENTS

| | | |
|---|---|---|
| JP | 2006-261547 A1 | 9/2006 |
| JP | 2021-064652 A | 4/2021 |
| JP | 2022-178486 A | 12/2022 |

(Continued)

OTHER PUBLICATIONS

Extended European Search Report dated Jan. 7, 2025 for corresponding European Patent Application No. 24190092.7.

(Continued)

*Primary Examiner* — Jason Y Ko
(74) *Attorney, Agent, or Firm* — OSTROLENK FABER LLP

(57)          ABSTRACT

A substrate processing system includes a transfer device provided with a shelf, a batch processing device, and a single-wafer processing device. The transfer device, the single-wafer processing device, and the batch processing device are linearly arranged in a row, in the order listed herein. The batch processing device includes a first batch transport mechanism that transports a plurality of substrates to a batch process bath, for example, all at once. The first batch transport mechanism receives the plurality of substrates converted into the vertical orientation on the transfer device side, and transports the substrates to, for example, a batch process bath directly, without using a substrate transport robot in the single-wafer processing device.

10 Claims, 15 Drawing Sheets

(56)        References Cited

U.S. PATENT DOCUMENTS

2024/0234189 A1      7/2024   Takahashi

FOREIGN PATENT DOCUMENTS

KR      10-2018-0063823        6/2018
TW              202247273  A    12/2022

OTHER PUBLICATIONS

Office Action dated Apr. 30, 2025 for corresponding Korean Patent
Application No. 10-2024-0097861.
Notice of Allowance dated Feb. 24, 2026 for Korean Patent Appli-
cation No. 10-2024-0097861 and its English translation.

FIG. 8A

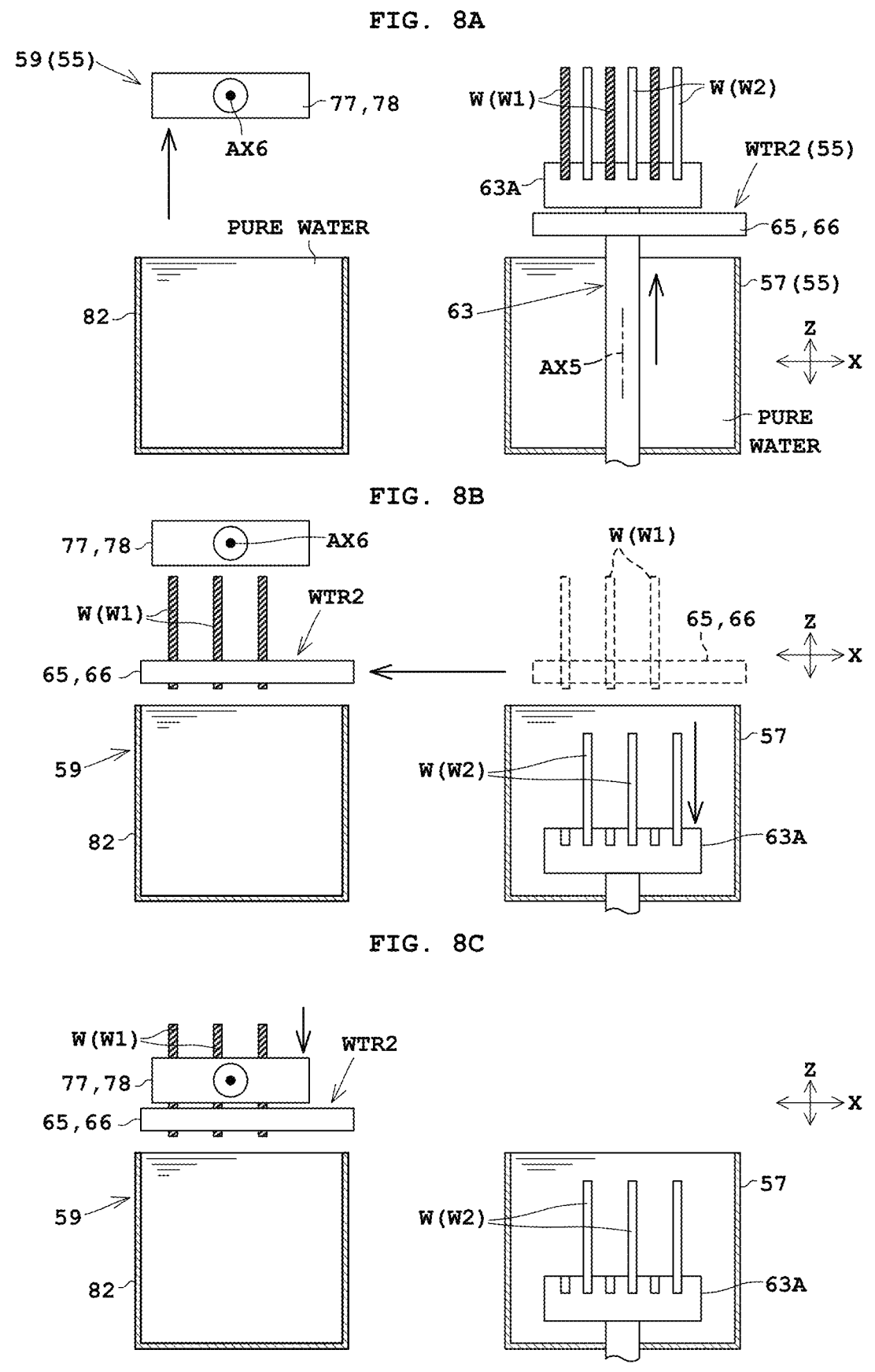

59(55)    77,78
AX6
PURE WATER
82

W(W1)    W(W2)
WTR2(55)
63A
65,66
63
57(55)
AX5
Z
X
PURE WATER

FIG. 8B 77,78    AX6
W(W1)    WTR2
65,66
59
82

W(W1)    WTR2
77,78
65,66
59
82

Z
X
W(W2)
57
63A

SUBSTRATE PROCESSING SYSTEM

CROSS-REFERENCE TO RELATED APPLICATIONS

This application claims priority to Japanese Patent Application No. 2023-121794 filed Jul. 26, 2023, the subject matter of which is incorporated herein by reference in entirety.

BACKGROUND

Technical Field

The present invention relates to a substrate processing system that processes a substrate. Examples of the substrate include a semiconductor substrate, a substrate for a flat panel display (FPD), a glass substrate for a photomask, a substrate for an optical disk, a substrate for a magnetic disk, a ceramic substrate, and a substrate for a solar cell. Examples of the FPD include a liquid crystal display device and an organic electroluminescence (EL) display device.

In a conventional substrate processing system, a loading/unloading device, a single-wafer processing device, an interface device, and a batch processing device are arranged in the order listed herein (see, for example, JP 2021-064652 A).

The loading/unloading device includes a stage where a cassette is placed, a first transport device, and a first transition device that temporarily stores therein a substrate. The single-wafer processing device includes a second transport device, and a second transition device that temporarily stores therein a substrate. The interface device includes a transport robot and a lot forming unit.

The first transport device takes out five substrates from the cassette, and transports the five substrates to the first transition device. In the cassette, the five substrates are held horizontally. The second transport device receives the five substrates from the first transition device, and transports the five substrates to the second transition device. The transport robot then receives the five substrates from the second transition device, and transports the five substrates to the lot forming unit. In the lot forming unit, the five substrates are held vertically.

SUMMARY

However, the conventional substrate processing system may suffer from a problem described below. For example, in the substrate processing system disclosed in JP 2021-064652 A, in order to process a plurality of substrates at once, in a process bath included in the batch processing device, the transport robot in the interface device places the plurality of substrates in the vertical orientation in the lot forming unit. Therefore, to transport the substrate from the loading/unloading device to the interface device, the substrates need to be passed through the single-wafer processing device. At this time, the second transport device is used to pass the substrates through the single-wafer processing device. The second transport device is also used for transporting the substrates from a liquid processing device included in the single-wafer processing device to a dryer device. An increase in the load of the second transport device transporting substrates may lead to a deterioration in the throughput of the substrate processing system.

The present invention has been made in view of such circumstances, and an object of the present invention is to provide a substrate processing system for preventing a deterioration in the throughput.

In order to achieve such an object, the present invention uses the following configurations. That is, a substrate processing system according to the present invention is a substrate processing system that performs batch processing for processing a plurality of substrates at once, and performs single-wafer processing for processing a single substrate at a time, among the plurality of substrates, the substrate processing system including: a transfer device including a carrier shelf on which a carrier is placed, the carrier being configured to store the plurality of substrates in a horizontal orientation, with a predetermined interval between the plurality of substrates; a batch processing device that processes the plurality of substrates at once; and a single-wafer processing device that processes a single substrate at a time, among the plurality of substrates. The transfer device, the single-wafer processing device, and the batch processing device are linearly arranged in a row in an order listed herein. The transfer device includes a first orientation converting unit that converts the plurality of substrates taken out from the carrier on the carrier shelf, from the horizontal orientation to a vertical orientation. The single-wafer processing device includes: a plurality of single-wafer processing units that process a single substrate at a time, among the plurality of substrates; and a first substrate transport mechanism that transports the plurality of substrates to the plurality of single-wafer processing units. The batch processing device includes: a batch processing unit that processes the plurality of substrates at once; and a first batch transport mechanism that transports the plurality of substrates to the batch processing unit at once. The first batch transport mechanism receives, on a side of the transfer device, the plurality of substrates having been converted by the first orientation converting unit to the vertical orientation, and transports the plurality of substrates directly to the batch processing unit without using the first substrate transport mechanism included in the single-wafer processing device.

With the substrate processing system according to the present invention, because the first substrate transport mechanism in the single-wafer processing device is not used in transporting the substrates from the transfer device to the batch processing device, the load of the first substrate transport mechanism is reduced, and the substrates are transported more quickly to the batch processing device. Therefore, it is possible to improve the throughput of the substrate processing system.

Furthermore, in the substrate processing system described above, preferably, the batch processing device includes a batch substrate transport section that is a section where the first batch transport mechanism moves; the batch substrate transport section is positioned on one end side of the transfer device in a second horizontal direction orthogonal to a first horizontal direction in which the transfer device and the batch processing device are arranged; the batch substrate transport section extends from the transfer device to the batch processing unit in the batch processing device; the batch processing unit performs the batch processing on the plurality of substrates transported by the first batch transport mechanism; the first batch transport mechanism receives the plurality of substrates having been subjected to the batch processing, and transports the plurality of substrates that are in the vertical orientation to the single-wafer processing device; the single-wafer processing device performs the single-wafer processing on a single substrate at a time, among the plurality of substrates having been subjected to the batch processing, using the plurality of single-wafer processing units; and the transfer device transports the plurality of substrates having been transported from the single-wafer processing device and having been subjected to the single-wafer processing, to the carrier placed on the carrier shelf.

The batch substrate transport section extends from the transfer device to the batch processing unit of the batch processing device. The batch substrate transport section is positioned on one end side of the transfer device in the second horizontal direction orthogonal to the first horizontal direction.

Furthermore, in the substrate processing system described above, preferably, the transfer device includes: a substrate handling mechanism including a hand that takes out the plurality of substrates that are in the horizontal orientation, from the carrier having been placed on the carrier shelf; the first orientation converting unit that converts the plurality of substrates that are in the horizontal orientation and transported by the substrate handling mechanism, to the vertical orientation; and a first vertical holder that holds the plurality of substrates received in the vertical orientation from the first orientation converting unit, and the first batch transport mechanism receives the plurality of substrates in the vertical orientation, from the first vertical holder.

The first batch transport mechanism can receive the plurality of substrates from the first vertical holder in the transfer device, and transport the plurality of vertically oriented substrates from the transfer device, by passing through the single-wafer processing device, to the batch processing device.

Furthermore, in the substrate processing system described above, preferably, the single-wafer processing device includes an interface section extending in the first horizontal direction; the plurality of single-wafer processing units is provided on an opposite side of the batch substrate transport section across the interface section; the interface section includes a horizontal orientation converting mechanism that converts the plurality of substrates transported in the vertical orientation by the first batch transport mechanism to the horizontal orientation, and the first substrate transport mechanism transports the plurality of substrates in the horizontal orientation, from the horizontal orientation converting mechanism to the plurality of single-wafer processing units.

As an example, it is assumed that the interface section is positioned between the single-wafer processing device and the batch processing device. In such a case, due to the presence of the interface section, the substrate processing system becomes elongated in the first horizontal direction that is the direction in which the transfer device and the batch processing device are arranged. By contrast, according to the present invention, the single-wafer processing device includes the interface section extending in the first horizontal direction, as well as the single-wafer processing unit. Furthermore, the single-wafer processing unit is provided on the opposite side of the batch substrate transport section, across the interface section. With such a configuration, it is possible to suppress the substrate processing system from becoming elongated in the first horizontal direction.

Furthermore, in the substrate processing system described above, preferably, the single-wafer processing device includes a passing section and a single-wafer substrate transport section both extending in the first horizontal direction; the batch substrate transport section, the passing section, and the single-wafer substrate transport section are arranged in an order listed herein in the second horizontal direction; the plurality of single-wafer processing units is arranged on an opposite side of the passing section across the single-wafer substrate transport section; the first substrate transport mechanism is provided to the single-wafer substrate transport section; the passing section includes a transfer-device-side section adjacent to the transfer device, and a batch-processing-device-side section adjacent to the transfer-device-side section and the batch processing device; the batch-processing-device-side section includes a horizontal orientation converting mechanism that converts the plurality of substrates transported in the vertical orientation by the first batch transport mechanism to the horizontal orientation; the horizontal orientation converting mechanism includes a second orientation converting unit that converts the plurality of substrates from the vertical orientation to the horizontal orientation, and a second substrate transport mechanism that is disposed on an opposite side of the batch processing device across the second orientation converting unit, and that transports a single substrate, among the plurality of substrates having been converted into the horizontal orientation; and the first substrate transport mechanism in the single-wafer substrate transport section receives the single substrate from the second substrate transport mechanism, and transports the single substrate to the plurality of single-wafer processing units.

According to the present invention, it is possible to suppress an increase in the length of the substrate processing system in the first horizontal direction. In addition, the horizontal orientation converting mechanism is provided to the batch-processing-device-side section of the passing section. The horizontal orientation converting mechanism includes the second orientation converting unit and the second substrate transport mechanism. The second substrate transport mechanism is disposed on the opposite side of the batch processing device across the second orientation converting unit. In other words, the second orientation converting unit and the second substrate transport mechanism are disposed in the order listed herein in the direction from the batch processing device toward the transfer device. Therefore, the first substrate transport mechanism can receive the substrates in the horizontal orientation at a position away from the batch processing device.

Furthermore, in the substrate processing system described above, the single-wafer substrate transport section includes: a third orientation converting unit disposed between the transfer device and the first substrate transport mechanism, the third orientation converting unit converting the plurality of substrates transported in the horizontal orientation by the first substrate transport mechanism to the vertical orientation; and a second vertical holder holding the plurality of substrates having been converted into the vertical orientation by the third orientation converting unit, in the vertical orientation; the first batch transport mechanism receives the plurality of substrates from the second vertical holder and transports the plurality of substrates in the vertical orientation to the transfer device, and the transfer device converts the plurality of substrates transported from the single-wafer processing device and having been subjected to the single-wafer processing, from the vertical orientation to the horizontal orientation, and transports the plurality of substrates having been converted into the horizontal orientation to the carrier placed on the carrier shelf.

The third orientation converting unit converts the plurality of substrates transported in the horizontal orientation by the first substrate transport mechanism to the vertical orientation. The first batch transport mechanism can receive the plurality of vertically oriented substrates from the third orientation converting unit via the second vertical holder, and transport the plurality of substrates from the single-wafer processing device to the transfer device. With such a configuration, an existing transfer device can be used as the transfer device.

Furthermore, in the substrate processing system described above, preferably, the horizontal orientation converting mechanism includes a standby bath disposed between the second orientation converting unit and the batch processing device, the standby bath storing an immersion liquid in which the plurality of substrates is immersed in the vertical orientation.

The horizontal orientation converting mechanism can keep a plurality of substrates standby in the vertical orientation, in a manner immersed in the immersion liquid stored in the standby bath.

Furthermore, in the substrate processing system described above, preferably, the horizontal orientation converting mechanism includes a second batch transport mechanism having a pair of chucks including a plurality of pairs of holding grooves and a plurality of pairs of passing grooves that are alternately arranged, and, when a substrate processing group including the plurality of substrates alternately arranged with another plurality of substrates is immersed in the immersion liquid in the standby bath, the second batch transport mechanism takes out the plurality of substrates from the substrate processing group using the pair of chucks, and transports the plurality of the substrates having been taken out to the second orientation converting unit.

The second batch transport mechanism can take out the plurality of substrates (first substrate group) from the substrate processing group including the plurality of substrates (first substrate group) alternately arranged with another plurality of substrates (second substrate group). The second orientation converting unit then converts the plurality of substrates having been taken out (first substrate group) to the horizontal orientation. By contrast, the other plurality of substrates (second substrate group) can be kept standby in a manner immersed in the immersion liquid in the standby bath. In this manner, it is possible to prevent the other plurality of substrates (second substrate group) from becoming dry while the substrates are kept standby.

In the substrate processing system, the first batch transport mechanism includes a pair of chucks that holds the plurality of substrates in the vertical orientation, and the first batch transport mechanism transports the plurality of substrates held in the vertical orientation by the pair of chucks.

In the substrate processing system described above, the batch processing unit is a batch process bath that stores a process liquid for immerging the plurality of substrates, and the plurality of single-wafer processing units is a plurality of single-wafer processing chambers.

With the substrate processing system according to the present invention, it is possible to prevent a deterioration in the throughput.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIGS. 8A to 8C are side views for explaining an operation of the second orientation converting mechanism;

DETAILED DESCRIPTION

Figure 1:
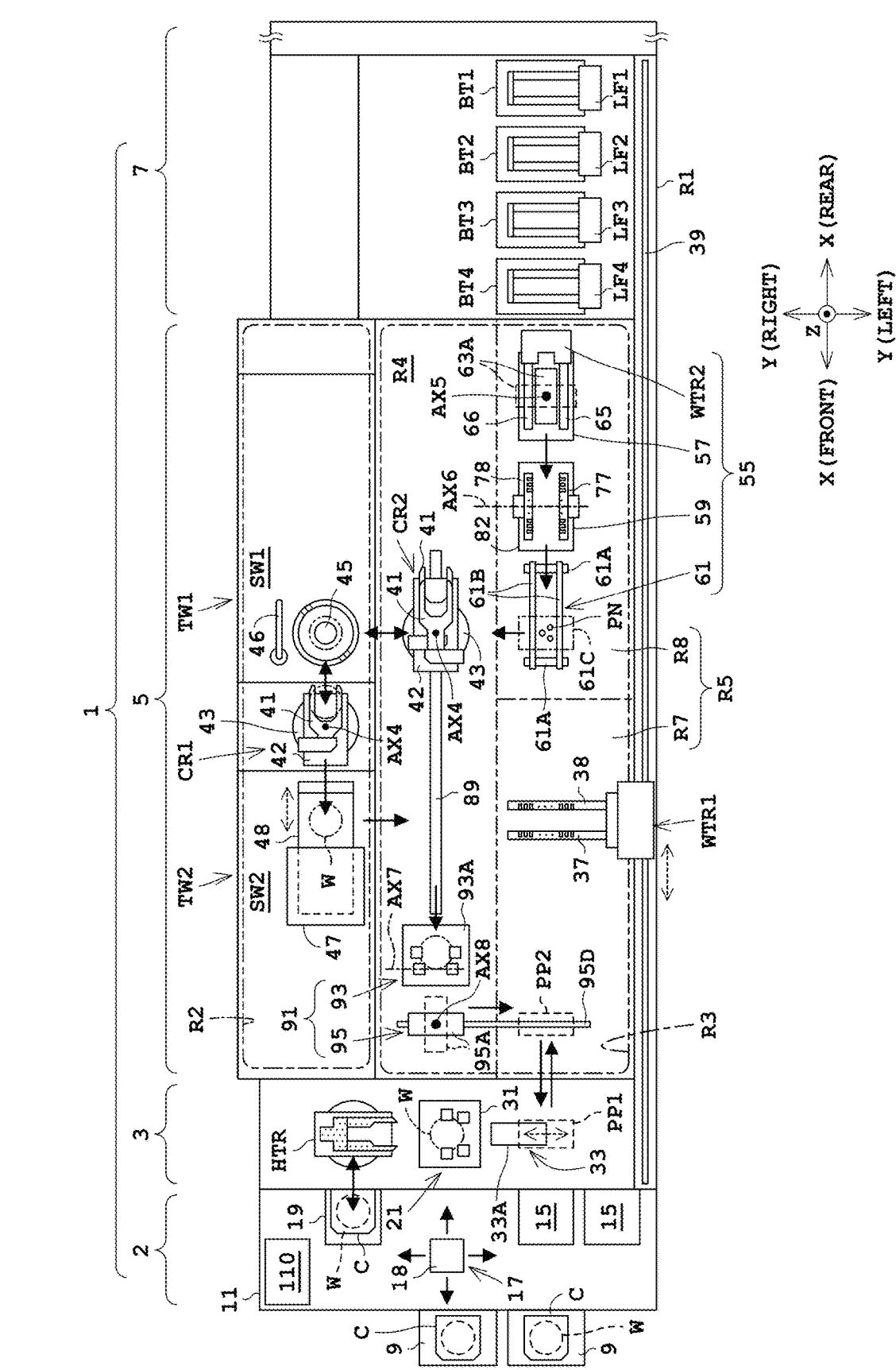
FIG. 1 is a plan view illustrating a schematic configuration of a substrate processing system.

An embodiment according to the present invention will now be described with reference to drawings. FIG. 1 is a plan view illustrating a schematic configuration of a substrate processing system 1.

<1. Overall Configuration>

The following description will refer to FIG. 1. The substrate processing system 1 includes a stocker device 2, a transfer device 3, a single-wafer processing device 5, a batch processing device 7, and a batch substrate transport section R1. The stocker device 2, the transfer device 3, the single-wafer processing device 5, and the batch processing device 7 are arranged linearly in a row, in the order listed herein. The batch substrate transport section R1 may be included in the batch processing device 7.

The substrate processing system 1 performs processing such as chemical liquid processing, cleaning processing, and drying processing on the substrates W. The substrate processing system 1 performs batch processing and single-wafer processing on a plurality of (for example, fifty or twenty-five) substrates W, continuously. Specifically, the substrate processing system 1 employs a processing approach that uses a combination of the batch processing and the single-wafer processing (what is called a hybrid approach). The batch processing is an approach for processing a plurality of vertically oriented substrates W at once.

The single-wafer processing is an approach for processing a single horizontally oriented substrate at a time, among a plurality of substrates W.

In the description herein, for the convenience, the direction in which the transfer device 3 and the batch processing device 7 are arranged will be referred to as a "front-back direction X". The front-back direction X is horizontal. In the front-back direction X, for example, the direction travelling from the batch processing device 7 toward the transfer device 3 will be referred to as "frontwards". The direction opposite to the frontwards direction will be referred to as "rearwards". The horizontal direction orthogonal to the front-back direction X will be referred to as "width directions Y". One of the "width directions Y" will be referred to as "rightwards", as appropriate. The direction opposite to the rightward direction will be referred to as "leftwards". The direction perpendicular to the horizontal direction will be referred to as "vertical directions Z". In each drawing, front, rear, right, left, top, and bottom are indicated as appropriate, for reference.

<2. Stocker Device>

In the stocker device 2, at least one carrier C is housed. The carrier C stores therein a plurality of (e.g., twenty-five) substrates W, in the horizontal orientation, at predetermined intervals (e.g., 10 mm). In the carrier C, the plurality of horizontally oriented substrates W are arranged in the vertical direction Z. As the carrier C, for example, a front opening unify pod (FOUP) is used, but the carrier C is not limited thereto.

The stocker device 2 has a plurality of (e.g., two) load ports 9 and a stocker body 11. The two load ports 9 are adjacent to the front side of the stocker body 11. The two load ports 9 are arranged along the width direction Y. Each of the two load ports 9 is for loading and unloading a carrier C. The stocker device 2 includes storage shelves 15 and a carrier transport robot 17. The storage shelves 15 are shelves for storing carriers C. On the storage shelves 15, carriers C are placed.

The carrier transport robot 17 transports the carrier C from and to the two load ports 9, the storage shelves 15, and a shelf 19, which will be described later. The carrier transport robot 17 has a gripper 18 that grips, for example, a protrusion provided on the top surface of the carrier C. With the carrier transport robot 17, the gripper 18 can move in the horizontal directions (the front-back directions X and the width directions Y) and the vertical directions Z. The carrier transport robot 17 is driven by one or more electric motors. Note that the carrier transport robot 17 may include, instead of the gripper 18, a movable support that supports the bottom surface of the carrier C.

<3. Transfer Device>

The transfer device 3 has a shelf 19 on which a carrier C is placed. The transfer device 3 takes out a plurality of (e.g., twenty-five) substrates W from a carrier C placed on the shelf 19. The transfer device 3 converts the plurality of (e.g., twenty-five or fifty) horizontally oriented substrates W to the vertical orientation. The transfer device 3 then delivers the plurality of substrates W having been converted to the vertical orientation, to a first batch transport mechanism WTR1 (to be described later). The transfer device 3 (substrate handling mechanism HTR) also converts a plurality of vertically oriented substrates W having been subjected to the single-wafer processing and transported from the single-wafer processing device 5, to the horizontal orientation, and transports the plurality of substrates W having been converted to the horizontal orientation, to the carrier C placed on the shelf 19.

The transfer device 3 will now be described in detail. The transfer device 3 includes the shelf 19, the substrate handling mechanism (robot) HTR, and a first orientation converting mechanism 21. The shelf 19 is a shelf where substrates W are taken out and stored. On the shelf 19, carriers C are placed. The shelf 19 corresponds to a carrier shelf according to the present invention.

The substrate handling mechanism HTR is positioned on the rear side of the shelf 19. The substrate handling mechanism HTR takes out a plurality of (e.g., twenty-five) horizontally oriented substrates W from the carrier C on the shelf 19, and transports the taken out substrates W to the first orientation converting mechanism 21.

Figure 2:
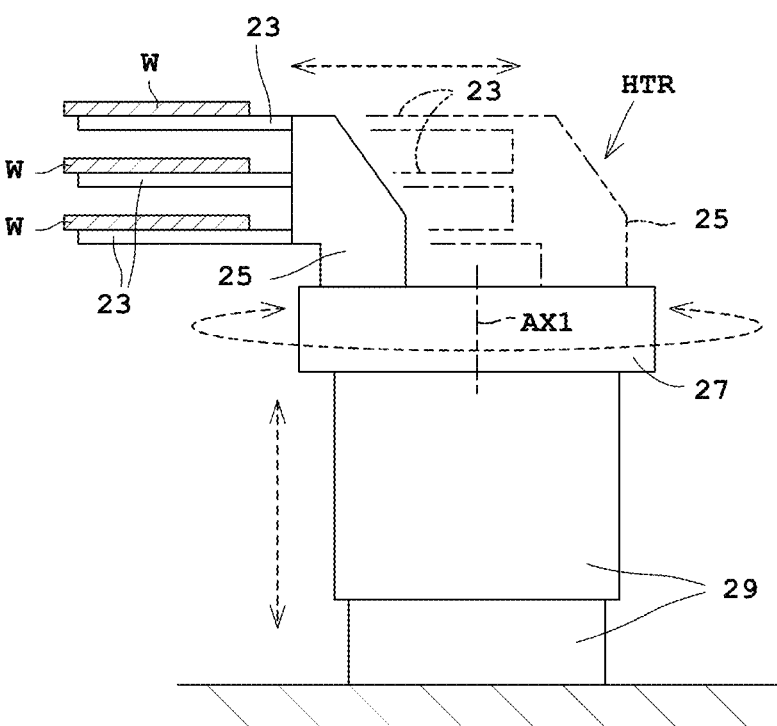
FIG. 2 is a side view illustrating a substrate handling mechanism.

The following description will refer to FIG. 2. The substrate handling mechanism HTR has a plurality of (e.g., twenty-five) hands 23. Each of the hands 23 holds one substrate W. In FIG. 2, for the convenience of illustration, the substrate handling mechanism HTR includes three hands 23. A pair of horizontal holders 31B and a pair of vertical holders 31C illustrated in in FIGS. 3A to 3F, to be described later, are configured to hold the three substrates W. A first pusher 33A, to be described later, is configured to support six substrates W.

The substrate handling mechanism HTR further includes a hand support 25, an advancing/retracting unit 27, and a rotating lift 29. The hand support 25 supports the plurality of hands 23. The plurality of hands 23 are therefore movable as a unit. The advancing/retracting unit 27 advances and retracts the hand support 25 to move the plurality of hands 23. The rotating lift 29 rotates the advancing/retracting unit 27 about a vertical axis AX1, to change the direction of the hands 23. Each of the advancing/retracting unit 27 and the rotating lift 29 includes an electric motor. The substrate handling mechanism HTR may also have a movable hand (not illustrated) for transporting only one substrate W, separately from the hands 23.

The following description will refer to FIGS. 1, and 3A to 3F. The first orientation converting mechanism 21 includes an orientation converting unit 31 and a first pusher mechanism 33. The substrate handling mechanism HTR, the orientation converting unit 31, and the first pusher mechanism 33 (including the first pusher 33A) are arranged in the order listed herein in the width direction Y orthogonal to the front-back direction X in which the transfer device 3 and the batch processing device 7 are arranged. That is, the orientation converting unit 31 is disposed on the left side of the substrate handling mechanism HTR, and the first pusher mechanism 33 is disposed on the left side of the orientation converting unit 31.

Figure 3A:
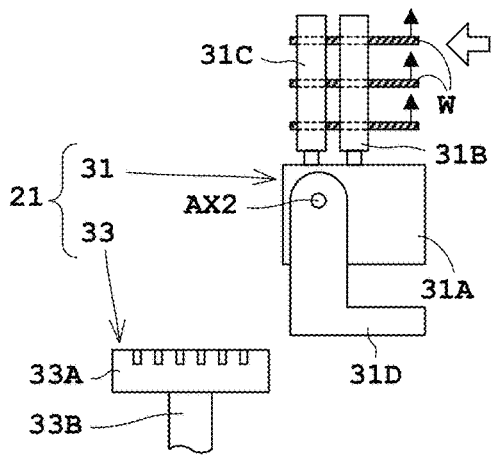
FIGS. 3A to 3F are side views for explaining a first orientation converting mechanism.

The following description will refer to FIG. 3A. The orientation converting unit 31 converts a plurality of (e.g., twenty-five) horizontally oriented substrates W, having been transported by the substrate handling mechanism HTR, to the vertical orientation. The orientation converting unit 31 includes a support base 31A, a pair of horizontal holders 31B, a pair of vertical holders 31C, and a rotation driving unit 31D. The pair of horizontal holders 31B and the pair of vertical holders 31C are provided on the support base 31A. While the substrates W are horizontally oriented, the pair of horizontal holders 31B supports the substrates W from the bottom, in a manner in contact with the bottom surfaces of the respective substrates W. While the substrates W are vertically oriented, the pair of vertical holders 31C holds the substrate W. The rotation driving unit 31D rotates the support base 31A about a horizontal axis AX2.

Figure 3B:
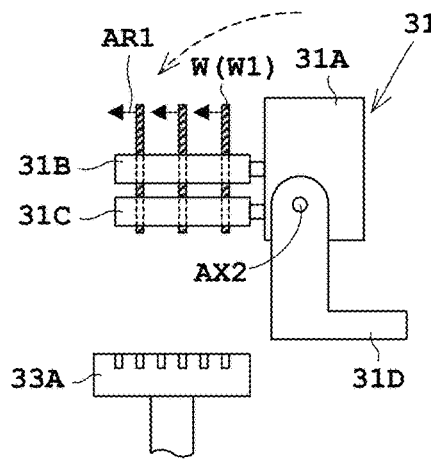
Figure 3C:
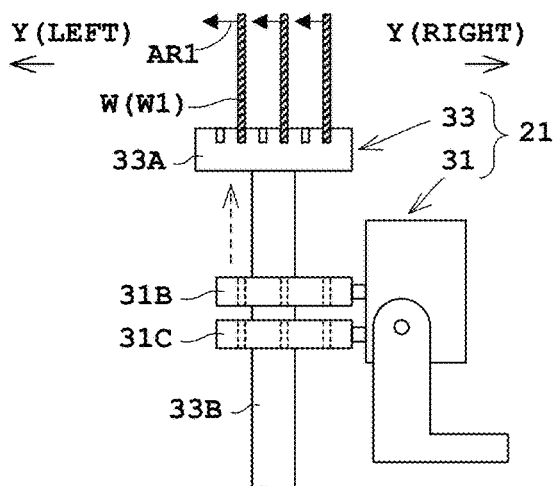
Figure 3D:
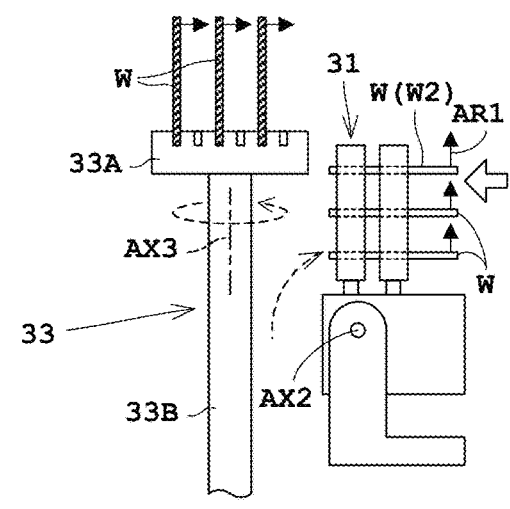
Figure 3E:
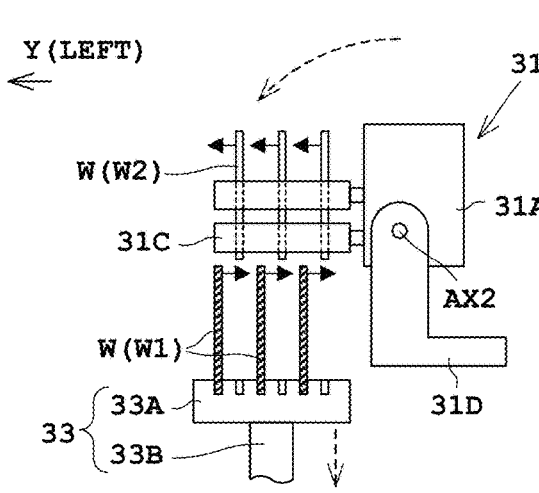
Figure 3F:
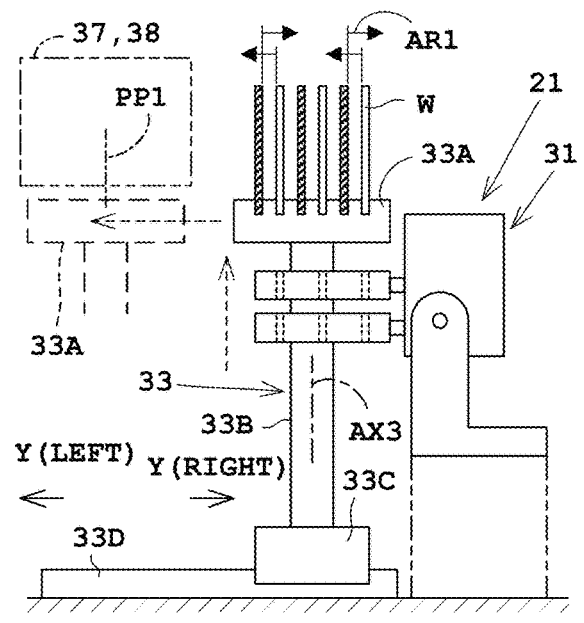

The following description will refer to FIG. 3F. The first pusher mechanism 33 includes a first pusher 33A, a rotating lift 33B, a horizontal actuator 33C, and a rail 33D. The first pusher 33A holds the lower part of each of a plurality of (e.g., twenty-five or fifty) vertically oriented substrates W. The first pusher 33A also holds the plurality of vertically oriented substrates W received from the orientation converting unit 31. The rotating lift 33B raises and lowers the first pusher 33A in the vertical directions Z. The rotating lift 33B also rotates the first pusher 33A about a vertical axis AX3. In this manner, it is possible to set the substrates W in such a manner that the device surfaces thereof, indicated by the arrow AR1, face any direction.

The horizontal actuator 33C moves the first pusher 33A and the rotating lift 33B horizontally along the rail 33D. The rail 33D extends in the width direction Y. Note that each of the rotation driving unit 31D, the rotating lift 33B, and the horizontal actuator 33C has an electric motor.

Note that the orientation converting unit 31 corresponds to a first orientation converting unit according to the present invention. The first pusher 33A corresponds to a first vertical holder according to the present invention. The front-back direction X corresponds to a first horizontal direction according to the present invention. The width direction Y corresponds to a second horizontal direction according to the present invention.

An operation of the first orientation converting mechanism 21 will now be described. For example, four batch process baths BT1 to BT4, to be described later, included in the batch processing device 7 process fifty substrates W corresponding to two carriers C, at once. Therefore, the first orientation converting mechanism 21 converts the fifty substrates W in units of twenty-five substrates, and passes the fifty substrates W (W1, W2) to the first pusher 33A. The twenty-five substrates W1 will be referred to as a first substrate group. The twenty-five substrates W2 will be referred to as a second substrate group. The fifty substrates W (W1, W2) will be referred to a substrate processing group. When the substrates W1, W2 are not particularly distinguished from each other, the substrates W1 and the substrates W2 will be referred to as substrates W.

The following description will refer to FIG. 3A. The orientation converting unit 31 receives the twenty-five substrates W1 from the substrate handling mechanism HTR. At this time, the twenty-five substrates W1 are in the horizontal orientation, and aligned with respect to one another at a full pitch (for example, at intervals of 10 mm). The full pitch will be sometimes referred to as a normal pitch. The device surface of each of the substrates W1 is facing upwards. The device surface of the substrate W is a surface on which an electronic circuit is formed, and will be referred to as a "front surface". The surface of the substrate W without any electronic circuit will be refer to as a rear surface. The surface on the opposite side of the device surface is the rear surface.

The following description will refer to FIG. 3B. The rotation driving unit 31D included in the orientation converting unit 31 rotates the pair of horizontal holders 31B and the like by 90 degrees about the horizontal axis AX2, to convert the horizontally oriented twenty-five substrates W1 to the vertical orientation. The following description will refer to FIG. 3C. The first pusher mechanism 33 raises the first pusher 33A, and then receives the twenty-five substrates W1 from the orientation converting unit 31.

The following description will refer to FIG. 3D. The first pusher mechanism 33 then rotates the first pusher 33A by 180 degrees about the vertical axis AX3. Accordingly, the twenty-five substrates W1 having been facing leftwards comes to face rightwards. The orientation converting unit 31 then receives the twenty-five substrates W2 from the substrate handling mechanism HTR. The following description will refer to FIG. 3E. The first pusher mechanism 33 lowers the first pusher 33A holding the twenty-five substrates W1 to the retracted position. The orientation converting unit 31 then converts the twenty-five horizontally oriented substrates W2 to the vertical orientation. Note that the orientation converting unit 31 and the first pusher mechanism 33 are operated so as not to interfere with each other.

The following description will refer to FIG. 3F. The first pusher mechanism 33 then raises the first pusher 33A holding the twenty-five substrates W1. With this, the first pusher 33A receives the additional twenty-five substrates W2. The first pusher 33A now holds fifty substrates W (W1, W2). The twenty-five substrates W1 and the twenty-five substrates W2 are alternately arranged. The fifty substrates W are aligned at a half pitch (e.g., at intervals of 5 mm). Note that the half pitch is an interval corresponding to a half of the full pitch.

The first pusher mechanism 33 then moves the first pusher 33A holding the fifty substrates W along the rail 33D, to a first substrate delivery position PP1 below a pair of chucks 37, 38 (to be described later) of the first batch transport mechanism WTR1 (to be described later).

<4. Batch Substrate Transport Section>

The following description will refer to FIG. 1. The batch substrate transport section R1 is disposed, for example, on one end side of the transfer device 3 in the width direction Y orthogonal to the front-back direction X along which the transfer device 3 and the batch processing device 7 are arranged. That is, the batch substrate transport section R1 is adjacent to the left side of the transfer device 3, the single-wafer processing device 5, and the batch processing device 7. The batch substrate transport section R1 extends from the transfer device 3 to the batch processing device 7 (four batch process baths BT1 to BT4, to be described later). That is, one end of the batch substrate transport section R1 extends to the transfer device 3 in the front-back direction X. The other end of the batch substrate transport section R1 extends to the batch processing device 7 (four batch process baths BT1 to BT4).

The batch substrate transport section R1 includes the batch transport mechanism (robot) WTR1. The first batch transport mechanism WTR1 transports the plurality of vertically oriented substrates W, to and from the first substrate delivery position PP1, a second substrate delivery position PP2, a standby bath 57, and the four batch process baths BT1 to BT4.

The first substrate delivery position PP1, the second substrate delivery position PP2, the standby bath 57, and the four batch process baths BT1 to BT4 are arranged in a row, in the front-back direction X. The first batch transport mechanism WTR1 therefore transports the plurality of substrates W in the front-back direction X.

The first batch transport mechanism WTR1 includes a pair of chucks 37, 38 and a guide rail 39. The pair of chucks 37, 38 includes, for example, fifty pairs of holding grooves for holding fifty vertically oriented substrates W. That is, each of the two chucks 37, 38 includes fifty holding grooves. Each of the two chucks 37, 38 extends in the width direction Y. The first batch transport mechanism WTR1 opens and closes the two chucks 37, 38. The two chucks 37, 38 hold a plurality of (e.g., fifty) substrates W aligned in the width direction Y. The guide rail 39 extends in the front-back direction X. The first batch transport mechanism WTR1 moves the pair of chucks 37, 38 along the guide rail 39. The first batch transport mechanism WTR1 is driven by an electric motor.

<5. Batch Processing Device>

The batch processing device 7 is adjacent to the rear side of the single-wafer processing device 5. The batch processing device 7 processes a plurality of substrates W at once. The batch processing device 7 applies predetermined batch processing to the plurality of substrates W transported by the first batch transport mechanism WTR1. The batch processing device 7 has the four batch process baths BT1 to BT4, for example. The four batch process baths BT1 to BT4 are arranged in a row, in the front-back direction X.

In each of the four batch process baths BT1 to BT4, a plurality of (e.g., twenty-five or fifty) substrates W are immersed all at once. Each of the four batch process baths BT1 to BT4 stores therein a process liquid (e.g., chemical liquid or pure water) for immersing the plurality of substrates W.

The four batch process baths BT1 to BT4 include, for example, two chemical liquid process baths BT1 and BT3 and two water cleaning process baths BT2 and BT4. The chemical liquid process bath BT1 and the water cleaning process bath BT2 together form one set, and the chemical liquid process bath BT3 and the water cleaning process bath BT4 together forms another set. The combinations of the chemical liquid process bath and the water cleaning process bath is not limited to this example. The number of batch process baths is not limited to four either, and may be one or more.

Each of the two chemical liquid process baths BT1 and BT3 performs etching processing using a chemical liquid. As the chemical liquid, for example, phosphoric acid is used. Each of the chemical liquid process baths BT1 and BT3 stores therein a chemical liquid supplied from a chemical liquid injection pipe, not illustrated. Each of the two water cleaning process baths BT2 and BT4 performs pure water cleaning processing, for cleaning the chemical liquid attached to the plurality of substrates W with pure water. As the pure water, deionized water (DIW) is used, for example. Each of the water cleaning process baths BT2 and BT4 stores therein pure water supplied from a pure water injection pipe, not illustrated.

The four batch process baths BT1 to BT4 are provided with four respective lifters LF1 to LF4. For example, the lifter LF1 holds the vertically oriented substrates W at a half pitch (e.g., an interval of 5 mm) that is a predetermined interval. The lifter LF1 raises and lowers the plurality of substrates W to and from a processing position inside the batch process bath BT1 and a delivery position above the batch process bath BT1. The other three lifters LF2 to LF4 have the same configurations as the lifter LF1. Each of the four batch process baths BT1 to BT4 corresponds to a batch processing unit according to the present invention.

<6. Single-Wafer Processing Device>

The single-wafer processing device 5 processes a single substrate at a time, among a plurality of (for example, fifty or twenty-five) substrates W. That is, the single-wafer processing device 5 performs predetermined single-wafer processing on a single substrate at a time, among the plurality of substrates W having been subjected to predetermined batch processing.

The single-wafer processing device 5 is adjacent to the rear side of the transfer device 3 and adjacent to the front side of the batch processing device 7. The single-wafer processing device 5 has a single-wafer substrate processing section R2 and an interface section R3 both extending in the front-back direction X. The interface section R3 includes a single-wafer substrate transport section R4 and a passing section R5 both extending in the front-back direction X.

Each of the single-wafer substrate processing section R2 and the interface section R3 (the single-wafer substrate transport section R4 and the passing section R5) extends from the transfer device 3 to the batch processing device 7. The single-wafer substrate processing section R2 and the interface section R3 are arranged side by side in the width direction Y. The single-wafer substrate transport section R4 and the passing section R5 are arranged side by side in the width direction Y. The batch substrate transport section R1, the passing section R5, the single-wafer substrate transport section R4, and the single-wafer substrate processing section R2 are arranged in the order listed herein in the width direction Y (toward the right in FIG. 1). That is, the single-wafer substrate processing section R2 is adjacent to the right side of the single-wafer substrate transport section R4. The passing section R5 is adjacent to the left side of the single-wafer substrate transport section R4. The batch substrate transport section R1 is adjacent to the left side of the passing section R5.

<6-1. Single-Wafer Substrate Processing Section>

The single-wafer substrate processing section R2 is provided on the opposite side of the batch substrate transport section R1, across the interface section R3. The single-wafer substrate processing section R2 is provided on the opposite side of the passing section R5, across the single-wafer substrate transport section R4.

The single-wafer substrate processing section R2 includes a rear tower TW1, a front tower TW2, and a substrate transport robot CR1. The rear tower TW1, the substrate transport robot CR1, and the front tower TW2 are provided along the single-wafer substrate transport section R4.

Figure 4:
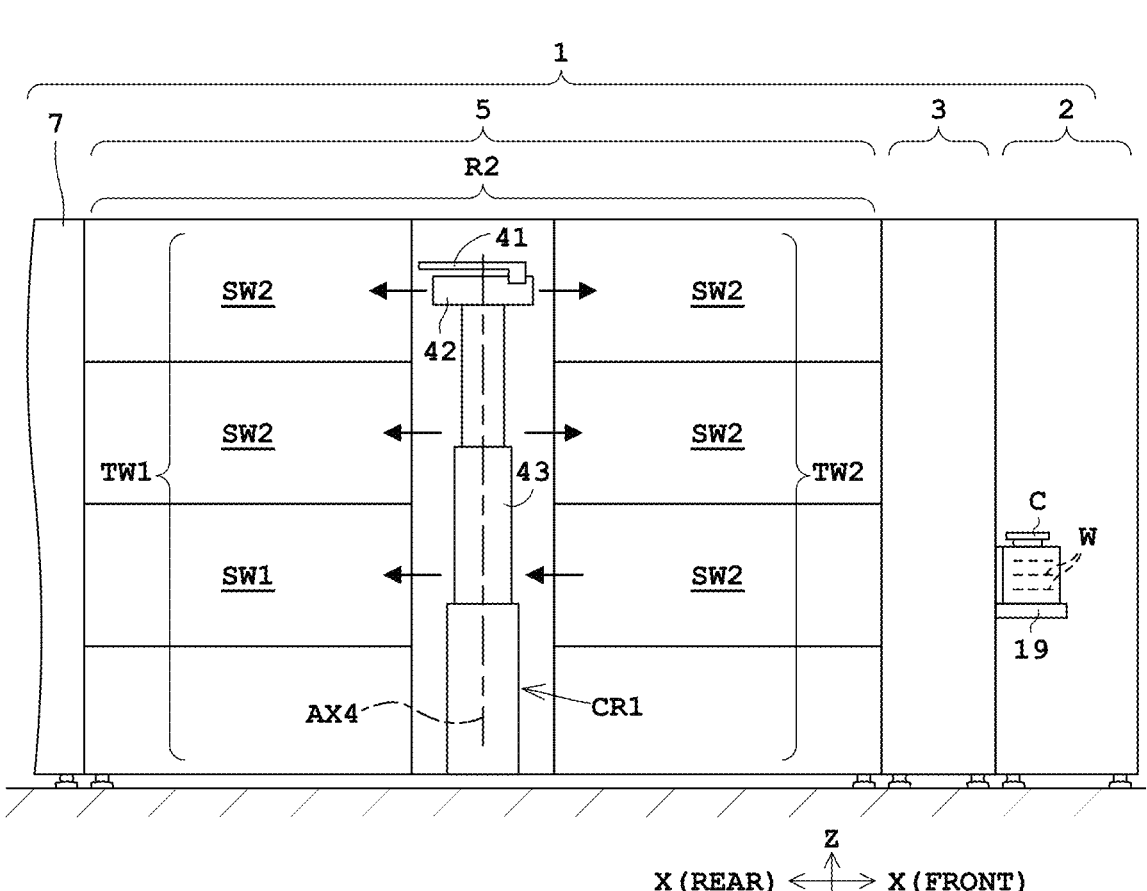
FIG. 4 is a left side view illustrating the substrate processing system.

The rear tower TW1 is provided on the rear side the substrate transport robot CR1. The front tower TW2 is provided on the front side of the substrate transport robot CR1. As illustrated in FIG. 4, the rear tower TW1 includes one first single-wafer processing chamber SW1 and two second single-wafer processing chambers SW2 that are stacked along the vertical direction Z. The front tower TW2 includes three second single-wafer processing chambers SW2 that are stacked along the vertical direction Z. That is, the single-wafer substrate processing section R2 includes six single-wafer processing chambers (the first single-wafer processing chamber SW1 and the second single-wafer processing chambers SW2). Each of the single-wafer processing chambers (the first single-wafer processing chamber SW1 and the second single-wafer processing chambers SW2) performs predetermined single-wafer processing on one substrate W. Each of the single-wafer processing chambers (the first single-wafer processing chamber SW1 and the second single-wafer processing chambers SW2) corresponds to a single-wafer processing unit according to the present invention.

The substrate transport robot CR1 includes a hand 41, an advancing/retracting unit 42, and a rotating lift 43. The hand 41 is enabled to hold and to move one substrate W in the horizontal orientation. The advancing/retracting unit 42 advances and retracts the hand 41. The rotating lift 43 raises and lowers the hand 41 and the advancing/retracting unit 42. The rotating lift 43 rotates the hand 41 and the advancing/retracting unit 42 about a vertical axis AX4, to change the direction of the hand 41.

The substrate transport robot CR1 transports one horizontally oriented substrate W to and from the three single-wafer processing chambers (the first single-wafer processing chamber SW1 and the second single-wafer processing chambers SW2) in the rear tower TW1 and the three second single-wafer processing chambers SW2 in the front tower TW2. The type and number of the single-wafer processing chambers included in the rear tower TW1 and the front tower TW2 are set as appropriate.

The first single-wafer processing chamber SW1 includes, for example, a holding and rotating unit 45 and a nozzle 46. The holding and rotating unit 45 includes a spin chuck that holds one horizontally oriented substrate W, and an electric motor that rotates the spin chuck about a vertical axis passing through the center of the substrate W. The nozzle 46 supplies a process liquid onto the substrate W held by the holding and rotating unit 45. As the process liquid, for example, pure water (e.g., DIW) and isopropyl alcohol (IPA) are used. In the first single-wafer processing chamber SW1, for example, after the substrate W is subjected to a cleaning processing with the pure water, a liquid film of IPA is formed on the top surface of the substrate W.

Each of the second single-wafer processing chambers SW2 performs, for example, drying processing that uses a supercritical fluid. As the fluid, carbon dioxide is used, for example. When carbon dioxide is used as the fluid, the supercritical state is achieved with a critical temperature of 31° C. and a critical pressure of 7.38 MPa. By performing the drying processing with the supercritical fluid, it is possible to suppress pattern collapse of the substrate W.

The second single-wafer processing chamber SW2 includes a chamber body (container) 47, a support tray 48, and a lid. The chamber body 47 has an internal processing space, an opening through which the substrate W is inserted into the processing space, a supply port, and an exhaust port. The substrate W is housed in the processing space, in a manner supported by the support tray 48. The lid closes the opening of the chamber body 47. For example, in each of the second single-wafer processing chambers SW2, the fluid is changed to the supercritical state, and the supercritical fluid is supplied into the processing space of the chamber body 47 through the supply port. With this supercritical fluid supplied to the processing space, the single substrate W is subjected to the drying process.

<6-2. Passing Section>

The passing section R5 includes a transfer-device-side section R7 and a batch-processing-device-side section R8. The transfer-device-side section R7 is adjacent to the rear side of the transfer device 3. The batch-processing-device-side section R8 is adjacent to the rear side of the transfer-device-side section R7, and adjacent to the front side of the batch processing device 7.

Figure 5:
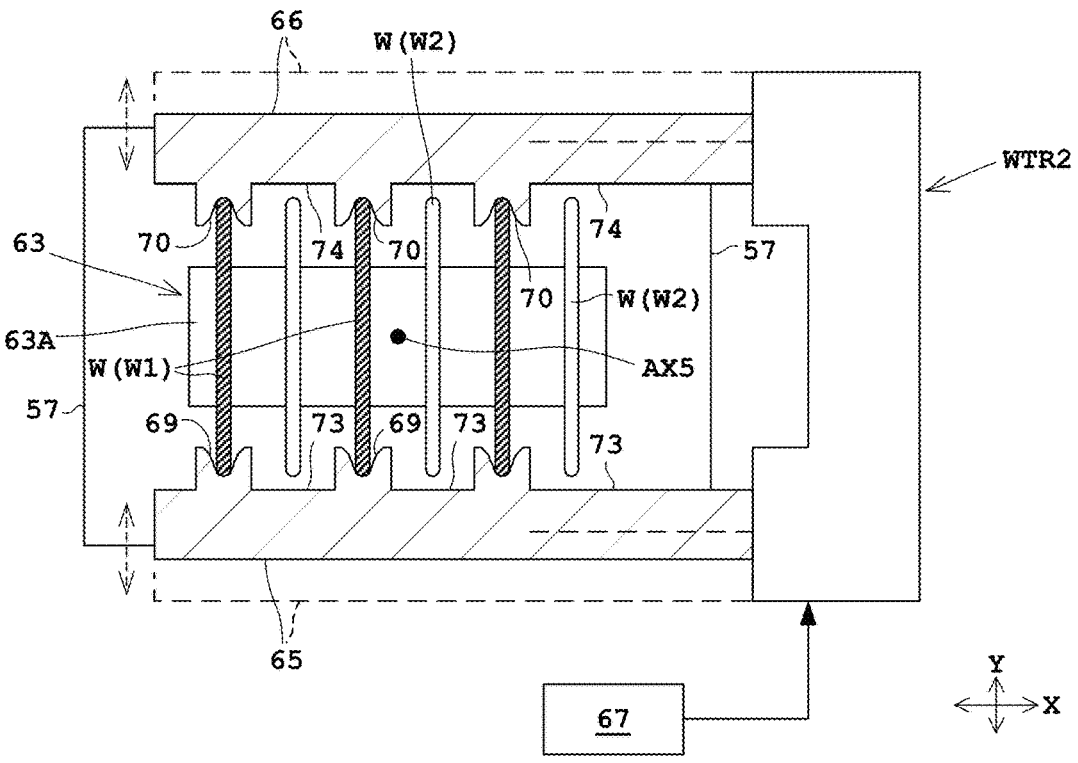
FIG. 5 is a plan view illustrating a standby bath, a second pusher mechanism, and a second batch transport mechanism.
Figure 6:
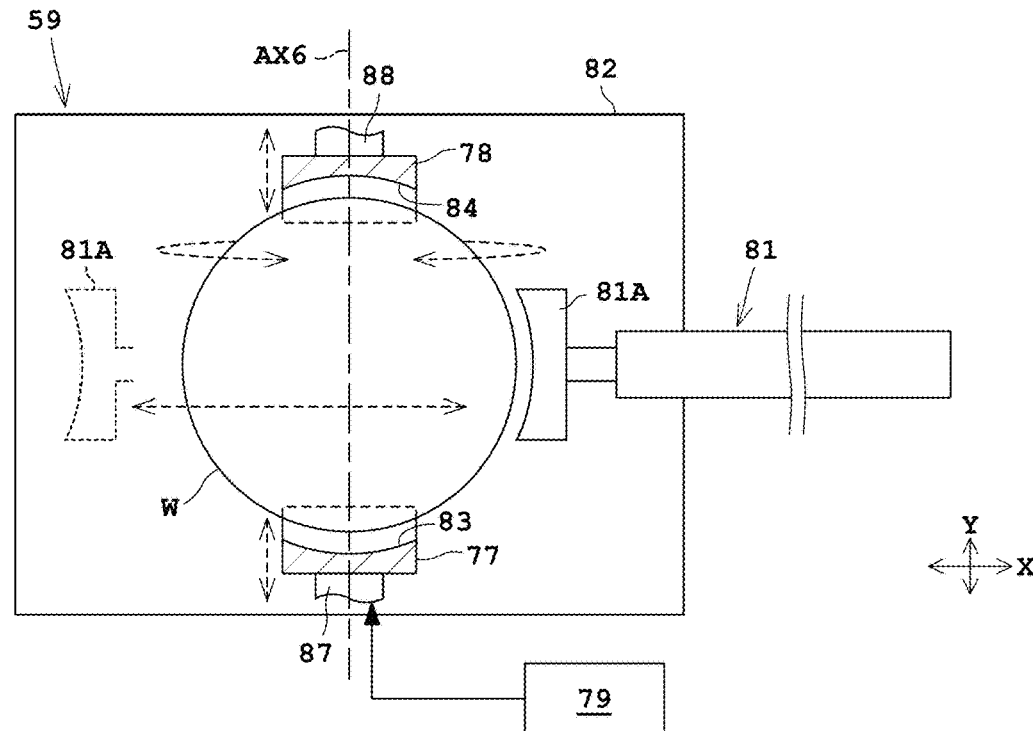
FIG. 6 is a plan view illustrating a second orientation converting unit.
Figures 7A, 7B:
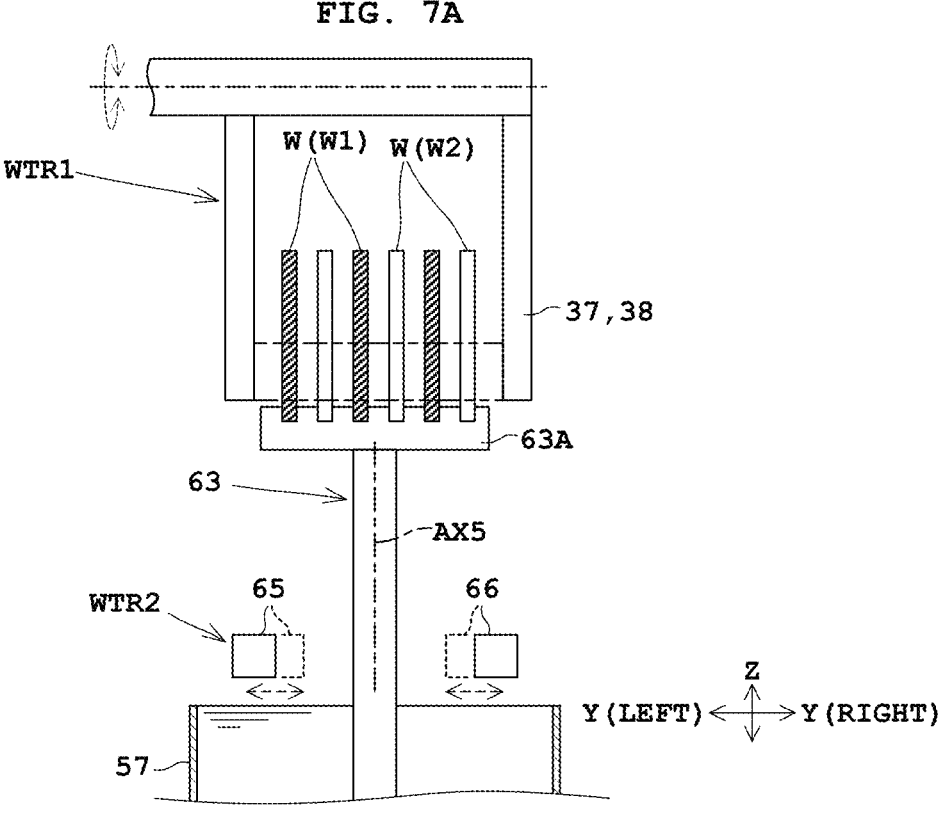
FIG. 7A is a side view illustrating how a second pusher receives the plurality of substrates from a first batch transport mechanism.
FIG. 7B is a side view illustrating how the plurality of substrates held on the second pusher are immersed in pure water in the standby bath.

FIG. 5 is a plan view illustrating the standby bath 57, a second pusher 63A, and a second batch transport mechanism WTR2. FIG. 6 is a plan view illustrating a second orientation converting unit 59. FIG. 7A is a schematic illustrating how the second pusher 63A receives the plurality of substrates W from the first batch transport mechanism WTR1. FIG. 7B is a view illustrating how the plurality of substrates W held by the second pusher 63A are immersed in the pure water in the standby bath 57.

<6-2-1. Batch-Processing-Device-Side Section>

As illustrated in FIG. 1, the batch-processing-device-side section R8 includes a second orientation converting mechanism 55. The second orientation converting mechanism 55 converts the plurality of vertically oriented substrates W having been transported by the first batch transport mechanism WTR1 to the horizontal orientation. The second orientation converting mechanism 55 includes the standby bath 57, the second batch transport mechanism (robot) WTR2, the second orientation converting unit 59, and a belt conveyor 61. The second orientation converting mechanism 55 corresponds to a horizontal orientation converting mechanism according to the present invention. The second orientation converting unit 59 corresponds to a second orientation converting unit according to the present invention. The belt conveyor 61 corresponds to a second substrate transport mechanism according to the present invention.

The standby bath 57 is disposed between the second orientation converting unit 59 and the batch processing device 7. That is, the standby bath 57 is positioned on the front side of the four batch process baths BT1 to BT4, and on the rear side of the second orientation converting unit 59. The standby bath 57 stores therein an immersion liquid in which the plurality of substrates is immersed in the vertical orientation W. As the immersion liquid, pure water (e.g., DIW) is used. The pure water is supplied from a pure water injection pipe, not illustrated.

As illustrated in FIGS. 5 and 7A, the standby bath 57 is provided with a second pusher mechanism 63. The second pusher mechanism 63 includes a second pusher 63A that holds the lower part of each of a plurality of (e.g., fifty or twenty-five) vertically oriented substrates W. The second pusher mechanism 63 can raise and lower the second pusher 63A, and rotate the second pusher 63A about a vertical axis AX5. The second pusher mechanism 63 is driven by at least one of an electric motor and an air cylinder.

The second batch transport mechanism WTR2 transports a plurality of (e.g., twenty-five) vertically oriented substrates W from the standby bath 57 to the second orientation converting unit 59 along a guide rail (not illustrated) extending in the front-back direction X.

The second batch transport mechanism WTR2 includes a pair of chucks 65, 66 and a driving unit 67. The pair of chucks 65, 66 includes a plurality of pairs (e.g., twenty-five pairs) of holding grooves 69, 70 and a plurality of pairs (e.g., twenty-five pairs) of passing grooves 73, 74. The twenty-five pairs of holding grooves 69, 70 and the twenty-five pairs of passing grooves 73, 74 are arranged alternately. The chuck 65 has the twenty-five holding grooves 69 and the twenty-five passing grooves 73. The chuck 66 also has the twenty-five holding grooves 70 and the twenty-five passing grooves 74. The pair of chucks 65, 66 may include the plurality of pairs of holding grooves 69, 70, without including the plurality of pairs of passing grooves 73, 74.

For example, it is assumed herein that a substrate processing group including fifty substrates W1, W2, with the twenty-five substrates W1 (first substrate group) and other twenty-five substrates W2 (second substrate group) arranged alternately, is sometimes immersed in the immersion liquid in the standby bath 57. In such a case, the second batch transport mechanism WTR2 takes out the twenty-five substrates W1 (W2) from the fifty substrates W1, W2 in the substrate processing group, using a pair of chucks 65, 66, and transports the taken out twenty-five substrates W1 (W2) to the second orientation converting unit 59.

The driving unit 67 in the second batch transport mechanism WTR2 causes the two chucks 65, 66 to open and to close. That is, the driving unit 67 moves the chucks 65, 66 in the width direction Y so as to bring the chucks 65, 66 close to each other or away from each other, for example. In FIG. 5, the solid lines indicate the positions of the chucks 65, 66 when the chucks 65, 66 are closed. At this time, the chucks 65, 66 hold twenty-five substrates W1, for example, out of the fifty substrates W1, W2 held on the second pusher 63A. The broken lines indicate the positions of the pair of chucks 65, 66 when the chucks 65, 66 are opened. The chucks 65, 66 then hold none of the fifty substrates W1, W2 held on the second pusher 63A.

The driving unit 67 moves the pair of chucks 65, 66 along the guide rail (not illustrated) extending in the front-back direction X. Each of the driving unit 67, a driving unit 79 (to be described later), and a horizontal push-out mechanism 81 (to described later) includes at least one of an electric motor and an air cylinder.

In FIGS. 5, 7A, and 8A, for the convenience of illustration, the second pusher 63A is illustrated to hold six substrates W (W1, W2). In FIG. 5, the pair of chucks 65, 66 has three pairs of holding grooves 69, 70 and three pairs of passing grooves 73, 74. It is also assumed herein that, in FIGS. 5, 8B, and 9A, each of the pairs of the chucks 65, 66 and the chucks 77, 78 holds three substrates W, as an example.

The following description will refer to FIGS. 1 and 6. The second orientation converting unit 59 converts a plurality of (e.g., twenty-five) vertically oriented substrates W to the horizontal orientation. The second orientation converting unit 59 is disposed between the belt conveyor 61 and the batch processing device 7. The second orientation converting unit 59 includes the pair of chucks 77, 78, the driving unit 79, the horizontal push-out mechanism 81, and an orientation converting bath 82. The second orientation converting unit 59 holds twenty-five substrates W, by nipping the twenty-five substrates W between the chucks 77, 78, for example. The pair of chucks 65, 66 has a plurality of pairs (e.g., twenty-five pairs) of holding grooves 83, 84. In FIG. 6, the chucks 77, 78 are illustrated as a transverse sectional view across a pair of holding grooves 83, 84.

The driving unit 79 causes the two chucks 77, 78 to open and to close. That is, the driving unit 79 moves the chucks 77, 78 in the width direction Y so as to bring the chucks 77, 78 close to each other or away from each other. In FIG. 6, the chucks 77, 78 are illustrated to be open. While the chucks 77, 78 are open, the twenty-five substrates W having been converted to the horizontal are placed on the twenty-five respective pairs of holding grooves 83, 84.

To the two chucks 77, 78, two rotating shafts 87, 88 are connected, respectively. Each of the rotating shafts 87, 88 extends in the width direction Y. The driving unit 79 rotates the chucks 77, 78 about the rotating shafts 87, 88 (horizontal axis AX6), respectively. The horizontal axis AX6 extends in the width direction Y.

The horizontal push-out mechanism 81 is disposed on the rear side of the substrate W held between the chucks 77, 78. As illustrated in FIG. 6, the horizontal push-out mechanism 81 includes a push-out member 81A that pushes one of the horizontally oriented substrates W. The horizontal push-out mechanism 81 moves the push-out member 81A in the front-back direction X.

The orientation converting bath 82 stores therein pure water (e.g., DIW) supplied from a pure water injection pipe, not illustrated. With this, the twenty-five substrates W held between the chucks 77, 78 can be immersed in the pure water in the orientation converting bath 82.

The following description will refer to FIG. 1. The belt conveyor 61 is positioned on the opposite side of the batch processing device 7, across the second orientation converting unit 59. That is, the belt conveyor 61 is disposed on the front side of the second orientation converting unit 59. The belt conveyor 61 conveys a single substrate W at a time, among the plurality of substrates W having been converted into the horizontal orientation, in the direction from the batch processing device 7 toward the transfer device 3 (that is, toward the front). The belt conveyor 61 includes two pulleys 61A, two belts 61B, and a pin lifter 61C. The two belts 61B are stretched around the two pulleys 61A. The pin lifter 61C is provided at the leading end of the belt conveyor 61. The pin lifter 61C includes three lift pins PN. Using the three lift pins PN, the pin lifter 61C raises one of the substrates W that are on the two belts 61B. Each of at least one of the two pulleys 61A and the pin lifter 61C is driven by an electric motor.

<6-2-2. Operation of Second Orientation Converting Mechanism>

An operation of the second orientation converting mechanism 55 will now be described. FIGS. 7A to 9C are schematics for explaining an operation of the second orientation converting mechanism 55. The lateral direction in FIGS. 7A and 7B corresponds to the width direction Y. The lateral direction in FIGS. 8A to 9C corresponds to the front-back direction X.

To begin with, the first batch transport mechanism WTR1 transports, for example, fifty substrates W having been processed in one of the two water cleaning process baths BT2 and BT4 to the position above the standby bath 57 in the single-wafer processing device 5. At this time, the fifty substrates W are aligned in the width direction Y. The second pusher mechanism 63 then raises the second pusher 63A. The second pusher mechanism 63 then rotates the second pusher 63A by 90 degrees about the vertical axis AX5 so that the fifty substrates W can be received from the first batch transport mechanism WTR1. With this, the holding grooves, not illustrated, provided to the second pusher 63A becomes aligned in the width direction Y. The second pusher 63A then holds the lower part of each of the fifty substrates W that are held between the pair of chucks 37, 38 of the first batch transport mechanism WTR1, as illustrated in FIG. 7A.

By then opening the pair of chucks 37, 38, the second pusher 63A receives fifty substrates W from the first batch transport mechanism WTR1. The second pusher mechanism 63 then lowers the second pusher 63A to a height position at which the chucks 37, 38 do not interfere with the fifty substrates W held by the second pusher 63A. The second pusher mechanism 63 then rotates the fifty substrates W by 90 degrees about the vertical axis AX5, as indicated by the broken lines in FIG. 7B, so that the fifty substrates W are aligned in the front-back direction X. Note that the fifty substrates W may be rotated in any direction.

The second pusher mechanism 63 then passes the fifty substrates W through between the two chucks 65, 66 of the second batch transport mechanism WTR2, and immerses the fifty substrates W aligned in the front-back direction X, in the pure water in the standby bath 57. At this time, the two chucks 65, 66 are kept open.

The following description will refer to FIG. 8A. The two chucks 65, 66 are still kept open. The second pusher mechanism 63 raises the fifty substrates W aligned in the front-back direction X, to pass the fifty substrates W through between the two chucks 65, 66. The driving unit 79 (see FIG. 6) of the second orientation converting unit 59 then raises the pair of chucks 77, 78.

The following description will refer to FIG. 8B. The chucks 65, 66 of the second batch transport mechanism WTR2 are then closed. The second pusher mechanism 63 then lowers the second pusher 63A. As a result, the second batch transport mechanism WTR2 holds twenty-five substrates W1, out of the fifty substrates W1, W2 held on the second pusher 63A (see the broken line in FIG. 8B), using the twenty-five pairs of holding grooves 83, 84 (see FIG. 5) of the chucks 65, 66. The twenty-five substrates W2 are passed through twenty-five respective pairs of passing grooves 73, 74 (see FIG. 5) of the chucks 65, 66. Therefore, the twenty-five substrates W2 remain on the second pusher 63A. The twenty-five substrates W2 are then immersed in the pure water in the standby bath 57 to prevent the twenty-five substrates W2 from drying.

The second batch transport mechanism WTR2 then moves the twenty-five substrates W1 held between the chucks 65, 66 to above the orientation converting bath 82, as indicated by a solid line in FIG. 8B. That is, the twenty-five substrates W1 are moved between the chucks 77, 78 and the orientation converting bath 82.

The following description will refer to FIG. 8C. The chucks 77, 78 are open. The second orientation converting unit 59 (driving unit 79) lowers the chucks 77, 78 to a predetermined height position. The second orientation converting unit 59 then nips the twenty-five substrates W1 between the chucks 77, 78. That is, the second orientation converting unit 59 closes the chucks 77, 78. As a result, the second orientation converting unit 59 holds the twenty-five substrates W1.

Figure 9A:
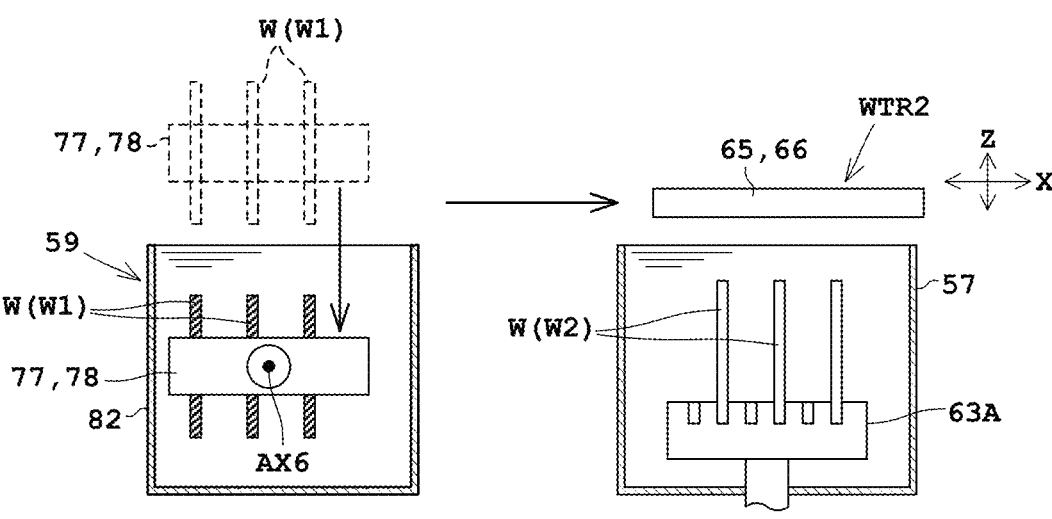
FIGS. 9A to 9C are side views for explaining the operation of the second orientation converting mechanism.

The following description will refer to FIG. 9A. The second batch transport mechanism WTR2 then opens the chucks 65, 66. As a result, the twenty-five substrates W1 are delivered to the chucks 77, 78 of the second orientation converting unit 59. The second batch transport mechanism WTR2 then moves the open chucks 65, 66 to above the standby bath 57. The second orientation converting unit 59 lowers the chucks 77, 78 holding the twenty-five substrates W1. As a result, the twenty-five substrates W1 are immersed in the pure water in the orientation converting bath 82.

Figure 9B:
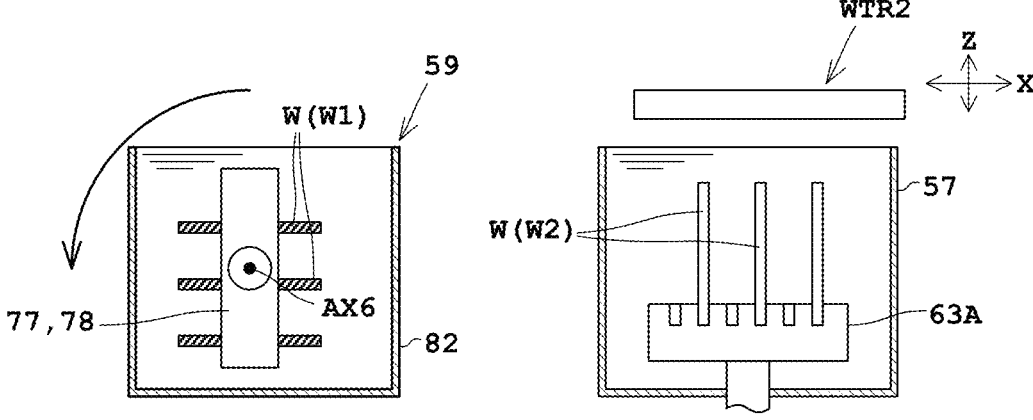

The following description will refer to FIG. 9B. For example, the second orientation converting unit 59 rotates the twenty-five substrates W1 about the two rotating shafts 87, 88 (horizontal axis AX6) by 90 degrees in the counter-clockwise direction. As a result, the orientation of the vertically oriented twenty-five substrates W1 are converted to the horizontal orientation, in the pure water of the orientation converting bath 82. The device surface of each of the substrates W1 comes to face upwards.

Figure 9C:
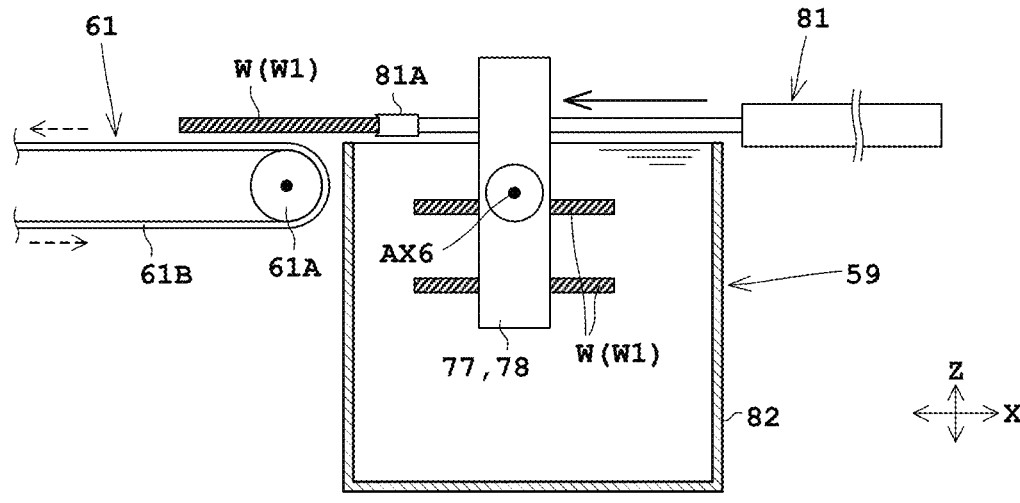

The following description will refer to FIG. 9C. The second orientation converting unit 59 then brings one of the horizontally oriented substrates W out of the pure water by raising the chucks 77, 78, for example. With the chucks 77, 78 open, the horizontal push-out mechanism 81 pushes out the one substrate W1 having been brought out of the pure water, frontwards, using the push-out member 81A. As a result, the one substrate W1 having been pushed out is transported onto the belt conveyor 61.

After the twenty-five substrates W1 are transported from the chucks 77, 78, the orientation of the remaining twenty-five substrates W2 immersed in the pure water in the standby bath 57 is converted to the horizontal orientation. The second batch transport mechanism WTR2 holds the twenty-five substrates W2, using the twenty-five pairs of holding grooves 69, 70 of the chucks 65, 66. When the twenty-five substrates W2 are converted to the horizontal orientation, the twenty-five substrates W2 may be rotated by 90 degrees in the clockwise direction. The remaining operations are performed in the same manner as when then orientation of the twenty-five substrates W1 is converted (see FIGS. 8A to 9C).

<6-3. Single-Wafer Substrate Transport Section>

The description will now go back to FIG. 1. The single-wafer substrate transport section R4 includes a substrate transport robot CR2. For example, the substrate transport robot CR2 transports one substrate W from the second orientation converting mechanism 55 to the one first single-wafer processing chamber SW1 in the horizontal orientation. That is, the substrate transport robot CR2 receives one substrate W from the belt conveyor 61, and transports the one substrate W into the one first single-wafer processing chamber SW1. The substrate transport robot CR2 also transports one substrate W to and from the six single-wafer processing chambers (the first single-wafer processing chamber SW1 and the second single-wafer processing chambers SW2), the second orientation converting mechanism 55, and a third orientation converting mechanism 91 (to be described later).

In the same manner as the substrate transport robot CR1, the substrate transport robot CR2 includes a hand 41, an advancing/retracting unit 42, and a rotating lift 43. The substrate transport robot CR2 also includes a guide rail 89 extending in the front-back direction X. The substrate transport robot CR2 (rotating lift 43) can move along the guide rail 89. Preferably, the substrate transport robot CR2 includes two hands 41. In such a case, a first hand 41 is used for transporting wet substrates W, and the second hand 41 is used for transporting the substrates W dried in the second single-wafer processing chamber SW2.

The third orientation converting mechanism 91 is included in the single-wafer substrate transport section R4. The third orientation converting mechanism 91 includes a third orientation converting unit 93 and a third pusher mechanism 95. The third orientation converting unit 93 converts a plurality of (e.g., twenty-five) horizontally oriented substrates W transported by the substrate transport robot CR2 to the vertical orientation. The third orientation converting unit 93 is positioned between the transfer device 3 and the substrate transport robot CR2. That is, the third orientation converting unit 93 is disposed on the rear side of the transfer device 3 and on the front side of the substrate transport robot CR2.

Figure 10A:
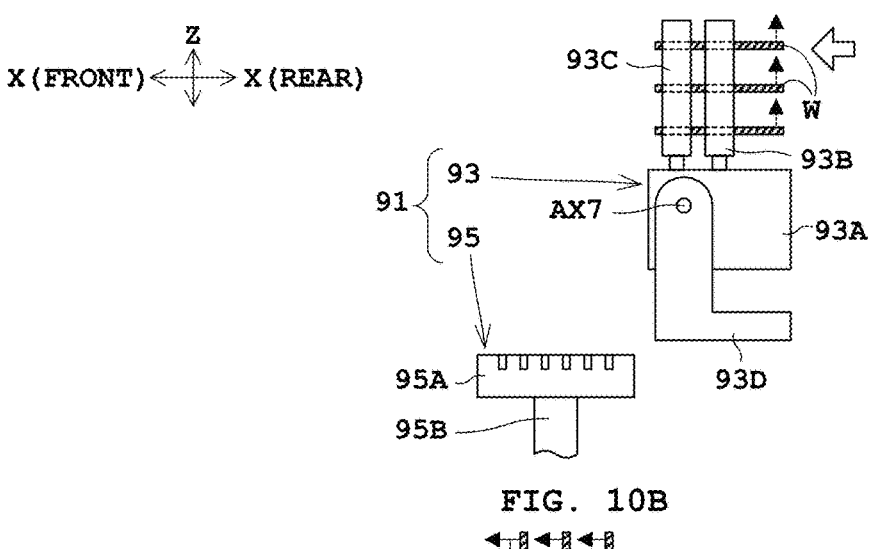
FIGS. 10A to 10C are side views for explaining a configuration and an operation of a third orientation converting mechanism.
Figure 10B:
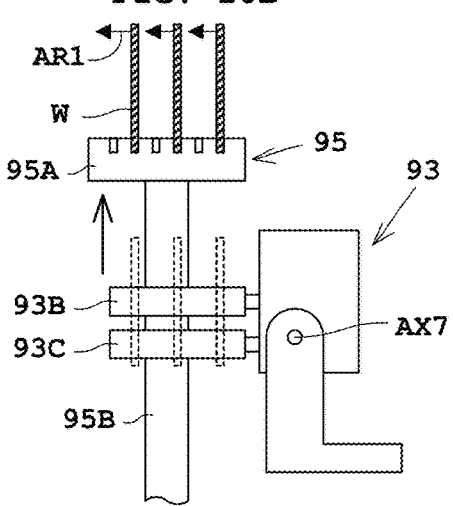
Figure 10C:
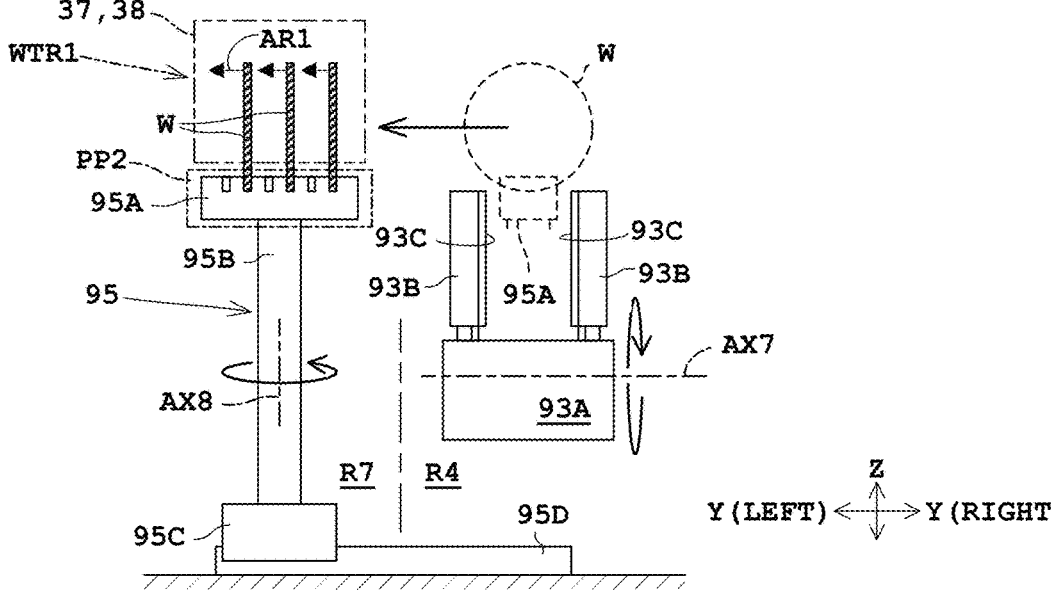

FIGS. 10A to 10C are side views for explaining the third orientation converting mechanism 91. The third orientation converting unit 93 includes a support base 93A, a pair of horizontal holders 93B, a pair of vertical holders 93C, and a rotation driving unit 93D. The support base 93A, the pair of horizontal holders 93B, and the pair of vertical holders 93C have the same configurations as those of the support base 31A, the pair of horizontal holders 31B, and the pair of vertical holders 31C, respectively, included in the first orientation converting unit 31. The rotation driving unit 93D in the third orientation converting unit 93 rotates the support base 93A about a horizontal axis AX7 extending in the width direction Y.

The third pusher mechanism 95 includes, as illustrated in FIG. 10C, a third pusher 95A, a rotating lift 95B, a horizontal actuator 95C, and a rail 95D. The third pusher 95A is positioned between the transfer device 3 and the third orientation converting unit 93 (see FIG. 1).

The third pusher 95A holds the lower part of each of the plurality of (e.g., twenty-five) substrates W having been converted into the vertical orientation by the third orientation converting unit 93. The rotating lift 95B raises and lowers the third pusher 95A, and rotates the third pusher 95A about a vertical axis AX8. The horizontal actuator 95C moves the third pusher 95A and the rotating lift 95B horizontally, along the rail 95D. The rotation driving unit 93D, the rotating lift 95B, and the horizontal actuator 95C are driven by an electric motor.

The rail 95D extends in the width direction Y. Specifically, the rail 95D extends from the single-wafer substrate transport section R4 to the transfer-device-side section R7.

In the transfer-device-side section R7, a second substrate delivery position PP2 is established. The third pusher 95A can move the plurality of substrates W having been converted into the vertical orientation by the third orientation converting unit 93 to the second substrate delivery position PP2 in the transfer-device-side section R7.

Each of the substrate transport robots CR1 and CR2 corresponds to a first substrate transport mechanism according to the present invention. The third pusher 95A corresponds to a second vertical holder according to the present invention. In FIGS. 10A to 10C, for convenience of illustration, the pair of horizontal holders 93B, the pair of vertical holders 93C, and the third pusher 95A are illustrated to hold three substrates W.

An operation of the third orientation converting mechanism 91 will now be described. The following description will refer to FIG. 10A. The substrate transport robot CR2 transports, for example, the substrate W having been processed in the second single-wafer processing chamber SW2 to the third orientation converting unit 93. The third orientation converting unit 93 holds the substrates W, using the pair of horizontal holders 93B and the pair of vertical holders 93C.

The following description will refer to FIG. 10B. When twenty-five substrates W are transported to the third orientation converting unit 93, for example, the third orientation converting unit 93 rotates the twenty-five substrates W by 90 degrees about the horizontal axis AX7, by tilting the pair of horizontal holders 93B and the like. As a result, the third orientation converting unit 93 converts the twenty-five horizontally oriented substrates W to the vertical orientation. The twenty-five substrates W having been converted to the vertical orientation are aligned in the front-back direction X.

The third pusher mechanism 95 then raises the third pusher 95A, to receive the twenty-five vertically oriented substrates W from the third orientation converting unit 93. The third pusher 95A holds the twenty-five substrates W that are aligned in the front-back direction X.

The following description will refer to FIG. 10C. The third orientation converting unit 93 then rotates the support base 93A by −90 degrees about the horizontal axis AX7, in order to bring up the pair of horizontal holders 93B and the like. The third pusher mechanism 95 then moves the third pusher 95A holding the twenty-five vertically oriented substrates W from the single-wafer substrate transport section R4 to the transfer-device-side section R7. That is, the third pusher mechanism 95 moves the third pusher 95A from the position where the substrates are delivered from the third orientation converting unit 93 to the second substrate delivery position PP2 for the first batch transport mechanism WTR1.

The third pusher mechanism 95 also rotates the third pusher 95A by 90 degrees about the vertical axis AX8 so that the twenty-five substrates W held by the third pusher 95A are aligned in the width direction Y. Note that this direction of the 90-degree rotation is a direction bringing the device surface to face upwards when the first orientation converting unit 31 converts the orientation to the horizontal orientation. With such an operation, the first batch transport mechanism WTR1 can transport twenty-five substrates W aligned in the width direction Y from the third orientation converting mechanism 91 (the second substrate delivery position PP2) to the first orientation converting mechanism 21 (the first substrate delivery position PP1).

<7. Control Unit>

The substrate processing system 1 includes a control unit 110 (see FIG. 1) and a storage unit (not illustrated). The control unit 110 controls each component included in the substrate processing system 1. The control unit 110 includes one or more processors such as a central processing unit (CPU). The storage unit includes at least one of a read-only memory (ROM), a random-access memory (RAM), and a hard disk, for example. The storage unit stores therein a computer program required in controlling each of the components included in the substrate processing system 1.

<8. Operation of Substrate Processing System>

Figure 11:
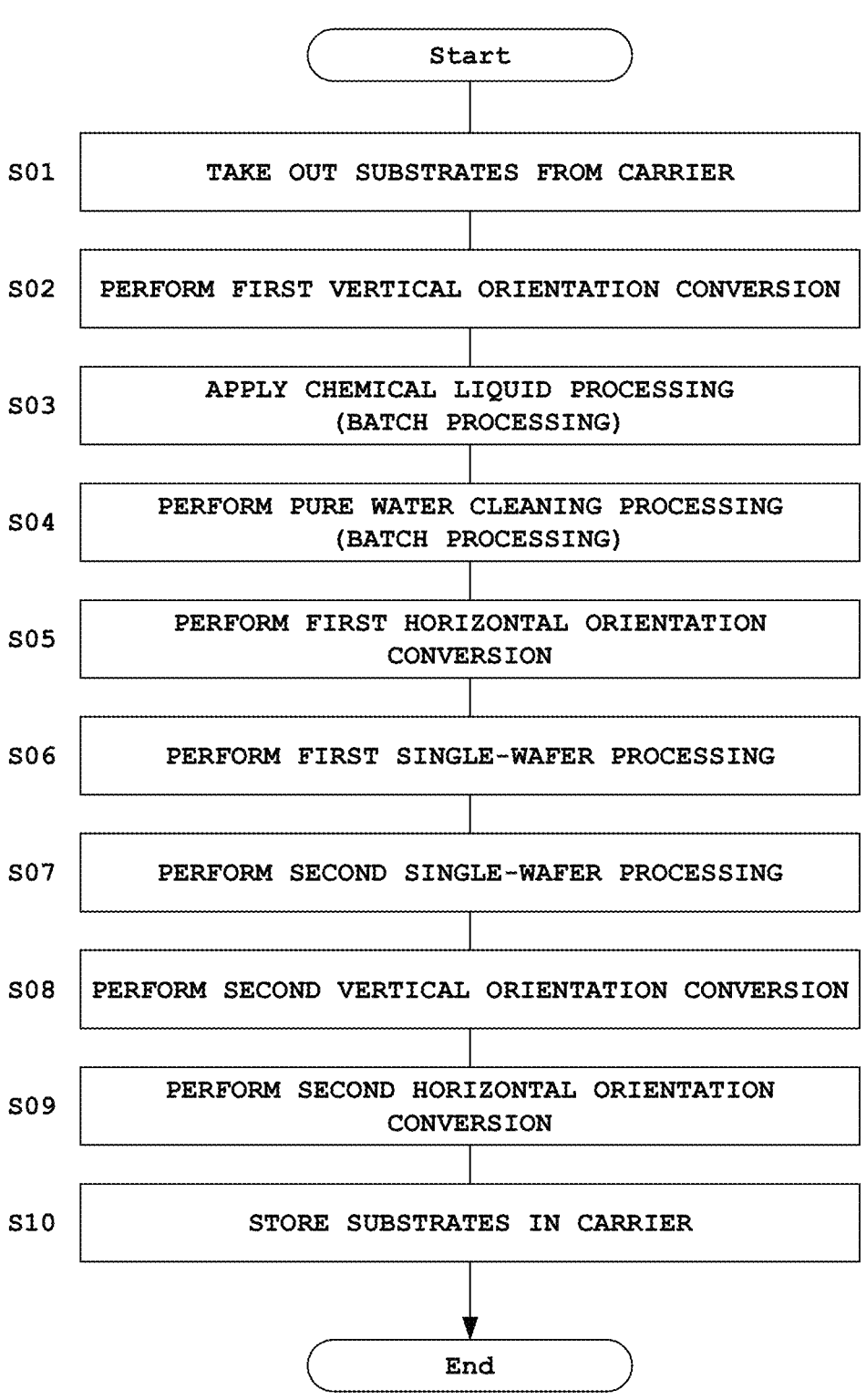
FIG. 11 is a flowchart for explaining an operation of the substrate processing system according to the embodiment.

An operation of the substrate processing system 1 will now be described with reference to the flowchart illustrated in FIG. 11. The following description will refer to FIG. 1.

[Step S01] Take Out Substrates from Carrier

An external transport robot, not illustrated, transports two carriers C onto the load ports 9, respectively. Each of the two carriers C stores therein twenty-five horizontally oriented substrates W, for example. The carrier transport robot 17 in the stocker device 2 transports the first carrier C from the load port 9 onto the shelf 19 by gripping the first carrier C with the gripper 18.

The substrate handling mechanism HTR takes out the twenty-five substrates W1 (first substrate group) from the first carrier C having been placed on the shelf 19, and transports the twenty-five horizontally oriented substrates W1 to the first orientation converting unit 31. The carrier transport robot 17 then transports the first carrier C (empty carrier), having the twenty-five substrates W1 taken out, from the shelf 19 onto the first storage shelf 15.

The carrier transport robot 17 then transports the second carrier C from the load port 9 onto the shelf 19. The substrate handling mechanism HTR takes out another twenty-five substrates W2 (second substrate group) from the second carrier C having been placed on the shelf 19, and transports the twenty-five horizontally oriented substrates W2 to the first orientation converting unit 31. The carrier transport robot 17 then transports the second carrier C (empty carrier), having the twenty-five substrates W2 taken out, from the shelf 19 onto the second storage shelf 15.

[Step S02] Perform First Vertical Orientation Conversion

As illustrated in FIGS. 3A to 3C, the first orientation converting unit 31 converts the twenty-five horizontally oriented substrates W1 to the vertical orientation, and the other twenty-five horizontally oriented substrates W2 to the vertical orientation, separately. The first pusher 33A in the first pusher mechanism 33 then holds fifty vertically oriented substrates W (W1, W2) including the twenty-five substrates W1 and the twenty-five substrates W2 arranged alternately. The first pusher mechanism 33 then transports the fifty substrates W to the first substrate delivery position PP1.

[Step S03] Apply Chemical Liquid Processing (Batch Processing)

At the first substrate delivery position PP1, the first batch transport mechanism WTR1 receives the fifty vertically oriented substrates W from the first pusher 33A of the first pusher mechanism 33. The first batch transport mechanism WTR1 then transports the fifty vertically oriented substrates W from the transfer device 3, through the single-wafer processing device 5, to the batch processing device 7. The first batch transport mechanism WTR1 then transports the fifty substrates W to either one of the two lifters LF1 and LF3, included in the two chemical liquid process baths BT1 and BT3, respectively.

The fifty vertically oriented substrates W held by the first pusher 33A in the transfer device 3 are in the orientation enabled to be subjected to the batch processing in the batch process baths BT1 to BT4. Therefore, the process can be shifted immediately to the batch processing after the fifty substrates W are transported to the batch processing device 7.

For example, the first batch transport mechanism WTR1 transports the fifty vertically oriented substrates W onto the lifter LF1 of the chemical liquid process bath BT1. The lifter LF1 receives the fifty substrates W at a position above the chemical liquid process bath BT1. The lifter LF1 then immerses the fifty substrates W into the chemical liquid (e.g., phosphoric acid) in the chemical liquid process bath BT1. As a result, etching processing (batch processing) takes place. After the etching processing, the lifter LF1 raises the fifty substrates W from the phosphoric acid in the chemical liquid process bath BT1. When the fifty substrates W are transported to the lifter LF3 of another chemical liquid process bath BT3, too, the same processing as in the chemical liquid process bath BT1 is performed.

[Step S04] Perform Pure Water Cleaning Processing (Batch Processing)

The first batch transport mechanism WTR1 receives the fifty vertically oriented substrates W from the lifter LF1, for example, and transports the fifty substrates W onto the lifter LF2 for the water cleaning process bath BT2. The lifter LF2 receives the fifty substrates W at a position above the water cleaning process bath BT2. The lifter LF2 then immerses the fifty substrates W into the pure water in the water cleaning process bath BT2. As a result, cleaning processing (batch processing) takes place.

When the first batch transport mechanism WTR1 has received the fifty vertically oriented substrates W from the lifter LF3, the first batch transport mechanism WTR1 transports the fifty substrates W to the lifter LF4 of the water cleaning process bath BT4. The lifter LF4 then immerses the fifty substrates W in the pure water in the water cleaning process bath BT4.

[Step S05] Perform First Horizontal Orientation Conversion

The first batch transport mechanism WTR1 receives the fifty substrates W having been subjected to the predetermined batch processing in one of the two batch process baths BT2 and BT4. That is, the first batch transport mechanism WTR1 receives the fifty substrates W having been subjected to the pure water cleaning processing from one of the two lifters LF2 and LF4. Before transporting the fifty substrates W, the lifter LF2 pulls up the fifty substrates W from the pure water in the pure water process bath BT2, for example. The first batch transport mechanism WTR1 then transports the fifty substrates W from the batch processing device 7 to the second orientation converting mechanism 55 in the single-wafer processing device 5. Specifically, the first batch transport mechanism WTR1 transports the fifty substrates W to a position above the standby bath 57 of the second orientation converting mechanism 55, which is disposed on the front side of the four batch process baths BT1 to BT4.

The second pusher mechanism 63 provided to the standby bath 57 receives the fifty substrates W using the second pusher 63A. At this time, as illustrated in FIGS. 7A and 7B, to align the fifty substrates W in the front-back direction X, the fifty substrates W aligned in the width direction Y are rotated by 90 degrees about the vertical axis AX5.

The second orientation converting unit 59 then converts the twenty-five vertically oriented substrates W1 to the horizontal orientation, and the other twenty-five vertically oriented substrates W2 to the horizontal orientation, separately, as illustrated in FIGS. 8A to 9C. The second orientation converting unit 59 then transports a single substrate at a time, from the twenty-five substrates W1 (twenty-five substrates W2) having been converted to the horizontal orientation, onto the belt conveyor 61. The belt conveyor 61 transports each of the horizontally oriented substrates W frontwards, to above the pin lifter 61C. The pin lifter 61C then raises the one substrate W on the two belts 61B, using the three lift pins PN.

[Step S06] Perform First Single-Wafer Processing

The substrate transport robot CR2 then receives the one wet substrate W lifted by the three lift pins PN of the pin lifter 61C, using the first hand 41, which is one of the two hands 41. The substrate transport robot CR2 then transports the substrate W received with the first hand 41 into the first single-wafer processing chamber SW1 included in the rear tower TW1.

In the first single-wafer processing chamber SW1, the holding and rotating unit 45 rotates the horizontally oriented substrate W, by holding the substrate W in such a manner that the device surface thereof facing upwards, and the pure water is supplied onto the device surface, via the nozzle 46. In the first single-wafer processing chamber SW1, IPA is supplied through the nozzle 46 onto the device surface (upper surface) of the substrate W, thereby replacing the pure water on the substrate W with the IPA.

[Step S07] Perform Second Single-Wafer Processing

The substrate transport robot CR1 in the single-wafer substrate processing section R2 then transports the substrate W having the pure water replaced with the IPA, from the first single-wafer processing chamber SW1 to one of the five second single-wafer processing chambers SW2. Each of the second single-wafer processing chambers SW2 performs the process of drying the one substrate W, using carbon dioxide in the supercritical state (supercritical fluid). With the drying process using the supercritical fluid, pattern collapsing is suppressed, on the pattern surface (device surface) of the substrate W.

[Step S08] Perform Second Vertical Orientation Conversion

The substrate transport robot CR2 then receives the one substrate W1 having been subjected to the drying processing from the second single-wafer processing chamber SW2, using the second hand 41, which is the other one of the two hands 41. The substrate transport robot CR2 then transports the substrate W1 received with the second hand 41 to the third orientation converting unit 93.

Once the twenty-five substrates W1 are delivered to the third orientation converting unit 93, the twenty-five substrates W are converted again to the vertical orientation, as illustrated in FIGS. 10A to 10C, and the twenty-five vertically oriented substrates W1 are moved to the second substrate delivery position PP2.

This operation will be explained specifically. The third orientation converting unit 93 converts the twenty-five horizontally oriented substrates W1 to the vertical orientation. In the third pusher mechanism 95, the third pusher 95A receives the twenty-five substrates W1. The third pusher mechanism 95 then rotates the twenty-five substrates W1 by 90 degrees about the vertical axis AX8 so that the twenty-five substrates W1 aligned in the front-back direction X are aligned in the width direction Y. The third pusher mechanism 95 then transports the twenty-five substrates W1 to the second substrate delivery position PP2.

When the twenty-five substrates W2 (second substrate group) are transported to the third orientation converting unit 93, the twenty-five substrates W2 are transported to the second substrate delivery position PP2 in the same manner as the twenty-five substrates W1 (first substrate group).

[Step S09] Perform Second Horizontal Orientation Conversion

The first batch transport mechanism WTR1 then transports the twenty-five vertically oriented substrates W1 (W2) from the single-wafer processing device 5 to the transfer device 3. That is, the first batch transport mechanism WTR1 receives the twenty-five substrates W1 (W2) from the third pusher 95A having moved to the second substrate delivery position PP2. The first batch transport mechanism WTR1 then transports the twenty-five vertically oriented substrates W1 (W2) to the first pusher 33A having moved to the first substrate delivery position PP1.

The first orientation converting unit 31 in the transfer device 3 then receives the twenty-five substrates W1 (W2) from the first pusher 33A. The first orientation converting unit 31 also converts the orientation of the twenty-five vertically oriented substrates W1 (W2) received from the first pusher 33A to the horizontal orientation. The way in which the orientation is converted to the horizontal orientation follows the steps in the order of FIGS. 3C, 3B, and 3A.

[Step S10] Storing Substrates in Carrier

On the shelf 19, the carrier transport robot 17 of the stocker device 2 has transported the first carrier (empty carrier) from the first storage shelf 15. The substrate handling mechanism HTR of the transfer device 3 receives the twenty-five substrates W1, which has been converted to the horizontal orientation by the first orientation converting unit 31 and has been subjected to the single-wafer processing, from the first orientation converting unit 31. The substrate handling mechanism HTR then transports and stores the twenty-five substrates W1 into the first carrier C placed on the shelf 19.

The carrier transport robot 17 then transports the first carrier C storing therein the twenty-five substrates W1 from the shelf 19 to one of the two load ports 9. The carrier transport robot 17 then transports a second carrier C (empty carrier) from the second storage shelf 15 onto the shelf 19. In the same manner, the substrate handling mechanism HTR receives the twenty-five substrates W2 having the orientation converted into the horizontal orientation from the first orientation converting unit 31, and stores the received twenty-five substrates W2 in the second carrier C placed on the shelf 19.

The carrier transport robot 17 then transports the second carrier C storing therein the twenty-five substrates W2 from the shelf 19 to one of the two load ports 9. The external transport mechanism, not illustrated, transports the two carriers C from the respective load ports 9, to the next destination.

According to the present embodiment, the transfer device 3, the single-wafer processing device 5, and the batch processing device 7 are arranged linearly in a row, in the order listed herein. Because the substrate transport robot CR2 in the single-wafer processing device 5 is not used in transporting the substrates W from the transfer device 3 to the batch processing device 7, the load of the substrate transport robot CR2 is reduced, and the substrates are transported quickly to the batch processing device 7. In this manner, it is possible to improve the throughput of the substrate processing system 1.

The batch substrate transport section R1 including the first batch transport mechanism WTR1 extends from the transfer device 3 to the batch processing device 7 (four batch process baths BT1 to BT4). Therefore, the first batch transport mechanism WTR1 can receive the plurality of substrates W from the transfer device 3, and transport the plurality of vertically oriented substrates W from the transfer device 3 to the batch processing device 7, by passing through the single-wafer processing device 5. After passing through the single-wafer processing device 5, the plurality of substrates W can be processed in the batch process bath BT1, for example, immediately.

Furthermore, for example, it is assumed that the batch processing device 7 has a first transfer device, and the single-wafer processing device has a second transfer device. In such a configuration, in order to cause the first transfer device to take out the unprocessed substrates W from the carrier C and to cause the second transport device to store the processed substrates W in the carrier C, the operation program for the substrate processing system 1 may become relatively complicated. According to the present embodiment, by contrast, the transfer device 3 is shared between the batch processing device 7 and the single-wafer processing device 5. Therefore, the operation program can be simplified.

Furthermore, for example, it is assumed that the interface section is positioned between the single-wafer processing device 5 and the batch processing device 7. In such a configuration, due to the interface section, the substrate processing system 1 becomes elongated in the front-back direction X that is the direction in which the transfer device 3 and the batch processing device 7 are arranged. By contrast, according to the present embodiment, the interface section R3 is included in the single-wafer processing device 5. Specifically, the single-wafer processing device 5 includes the interface section R3 extending in the front-back direction X, and the first single-wafer processing chamber SW1, for example. The first single-wafer processing chamber SW1 is provided on the opposite side of the batch substrate transport section R1, across the interface section R3. With such a configuration, it is possible to suppress the substrate processing system 1 from becoming elongated in the front-back direction X.

In addition, the second orientation converting mechanism 55 is provided in the batch-processing-device-side section R8 of the passing section R5. The second orientation converting mechanism 55 includes the second orientation converting unit 59 and the belt conveyor 61. The belt conveyor 61 is positioned on the opposite side of the batch processing device 7, across the second orientation converting unit 59. That is, the second orientation converting unit 59 and the belt conveyor 61 are arranged in the order listed herein in the direction from the batch processing device 7 toward the transfer device 3 (toward the front). Therefore, the substrate transport robot CR2 can receive the horizontally oriented substrate W at a position away from the batch processing device 7. Hence, the distance by which the substrate W is transported by the substrate transport robot CR2 is reduced, and the substrate W can be transported efficiently.

Furthermore, the third orientation converting unit 93 converts a plurality of horizontally oriented substrates W transported by the substrate transport robot CR2 to the vertical orientation. The first batch transport mechanism WTR1 can receive a plurality of substrates W in the vertical orientation from the third orientation converting unit 93 via the third pusher 95A, and transport the plurality of substrates W from the single-wafer processing device 5 to the transfer device 3. With such a configuration, an existing transfer device can be used as the transfer device 3.

Furthermore, the second orientation converting mechanism 55 can immerse the plurality of vertically oriented substrates W in the immersion liquid stored in the standby bath 57, while keeping the plurality of substrates W standby.

Furthermore, the second batch transport mechanism WTR2 can take out the plurality of substrates W1 (first substrate group) from the substrate processing group in which the plurality of substrates W1 (first substrate group) and the other plurality of substrates W2 (second substrate group) are alternately arranged. The second orientation converting unit 59 then converts the plurality of substrates W1 having been taken out (first substrate group) to the horizontal orientation. By contrast, the other plurality of substrates W2 (second substrate group) can be kept standby in a manner being immersed in the immersion liquid in the standby bath 57. As a result, it is possible to prevent the other plurality of substrates W2 (second substrate group) from becoming dry while the substrates are kept standby.

The present invention is not limited to the embodiments described above, and following modifications are still possible.

(1) In the embodiment described above, the second orientation converting mechanism 55 includes the standby bath 57 and the second pusher mechanism 63. In this regard, it is also possible for the second orientation converting mechanism 55 not to include the standby bath 57, but include the second pusher mechanism 63.

Figure 12A:
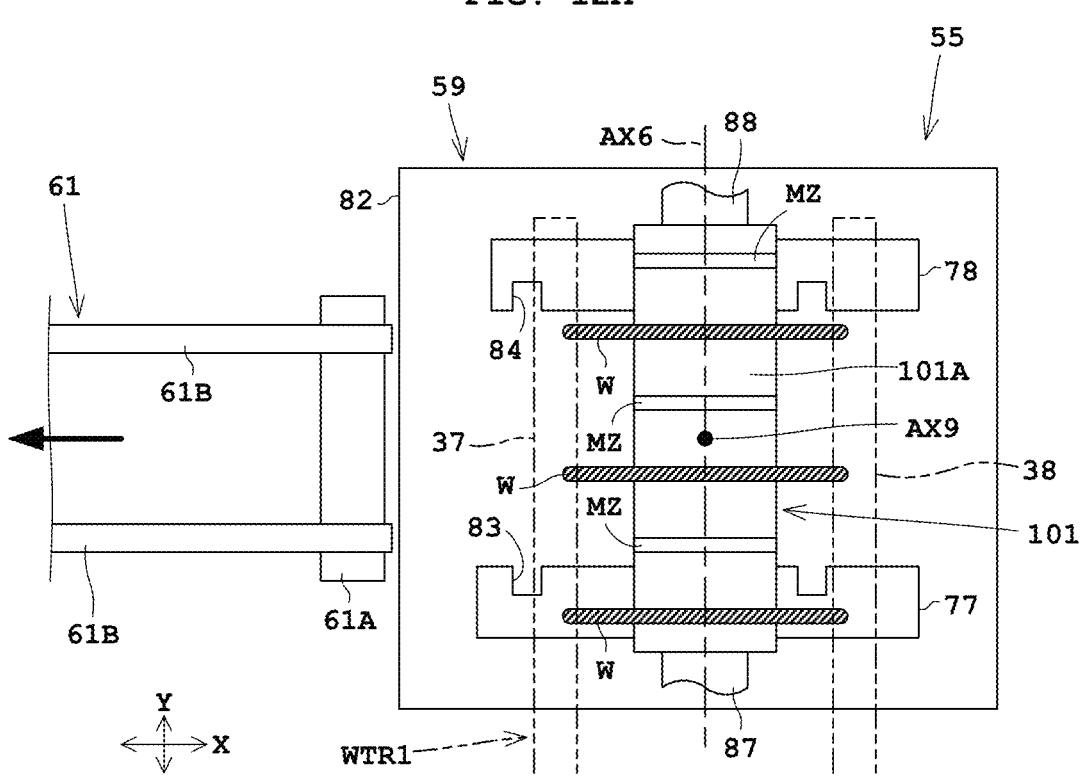
FIGS. 12A and 12B are plan views for explaining a second orientation converting unit according to a modification.
Figure 12B:
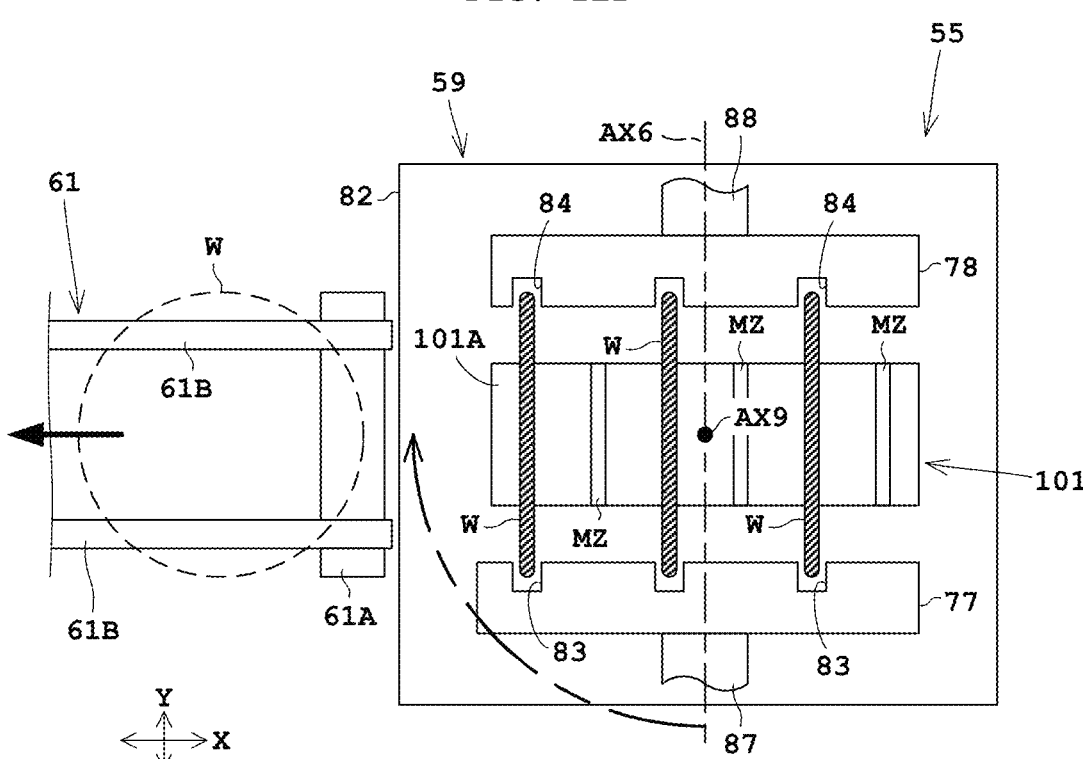

(2) In the embodiment described above, the second orientation converting mechanism 55 includes the standby bath 57, the second pusher mechanism 63, and the second batch transport mechanism WTR2. In this regard, it is also possible for the second orientation converting mechanism 55 not to include any of the standby bath 57, the second pusher mechanism 63, and the second batch transport mechanism WTR2. In such a case, the second orientation converting unit 59 may include a fourth pusher mechanism 101, as illustrated in FIGS. 12A and 12B.

The fourth pusher mechanism 101 includes a fourth pusher 101A that holds lower part of each of a plurality of (e.g., twenty-five) vertically oriented substrates W. The fourth pusher mechanism 101 raises and lowers the fourth pusher 101A and rotates the fourth pusher 101A about a vertical axis AX9, using one or more electric motors, not illustrated.

The fourth pusher 101A is disposed on the bottom of the orientation converting bath 82. As illustrated in FIG. 12A, the first batch transport mechanism WTR1 moves the pair of chucks 37, 38 holding twenty-five substrates W to above the orientation converting bath 82.

The fourth pusher mechanism 101 raises the fourth pusher 101A, allowing the fourth pusher 101A to pass through between the pair of chucks 77, 78 of the second orientation converting unit 59. The fourth pusher mechanism 101 also rotates the fourth pusher 101A by 90 degrees about the vertical axis AX9. Accordingly, it is possible to change the direction in which a plurality of holding grooves MZ provided on the fourth pusher 101A are aligned, from the front-back direction X to the width direction Y. The plurality of holding grooves MZ are grooves for holding the plurality of respective substrates W. In this manner, the fourth pusher 101A can receive the twenty-five substrates W aligned in the width direction Y from the pair of chucks 37, 38 of the first batch transport mechanism WTR1.

The first batch transport mechanism WTR1 then moves the pair of chucks 37, 38 away from above the orientation converting bath 82. The fourth pusher mechanism 101 rotates the fourth pusher 101A by 90 degrees in any direction about the vertical axis AX9. As a result, the twenty-five substrates W (or the plurality of holding grooves MZ) aligned in the width direction Y become aligned in the front-back direction X.

The fourth pusher mechanism 101 then lowers the fourth pusher 101A holding the twenty-five substrates W so that the twenty-five substrates W pass through between the pair of chucks 77, 78 that are open, as illustrated in FIG. 12B. The pair of chucks 77, 78 then nips the twenty-five substrates W held on the fourth pusher 101A, therebetween. In other words, the pair of chucks 77, 78 is closed. As a result, the pair of chucks 77, 78 come to hold twenty-five substrates W. The fourth pusher 101A is then lowered to the bottom of the orientation converting bath 82, the bottom being where the fourth pusher 101A does not interfere with the twenty-five substrates W and the like held between the pair of chucks 77, 78. The second orientation converting unit 59 then rotates the pair of chucks 77, 78 by 90 degrees in any direction about the horizontal axis AX6. As a result, the second orientation converting unit 59 converts the twenty-five substrates W from the vertical orientation to the horizontal orientation, with the device surface facing upwards.

(3) In the embodiment and each of the modifications described above, the belt conveyor 61, the second orientation converting unit 59, and the standby bath 57 are arranged toward the rear side in the order listed herein. In this regard, the standby bath 57, the second orientation converting unit 59, and the belt conveyor 61 may be disposed toward the rear side, in the order listed herein. In other words, the belt conveyor 61, the second orientation converting unit 59, and the standby bath 57 illustrated in FIG. 1 may be arranged in the reverse direction.

Figure 13:
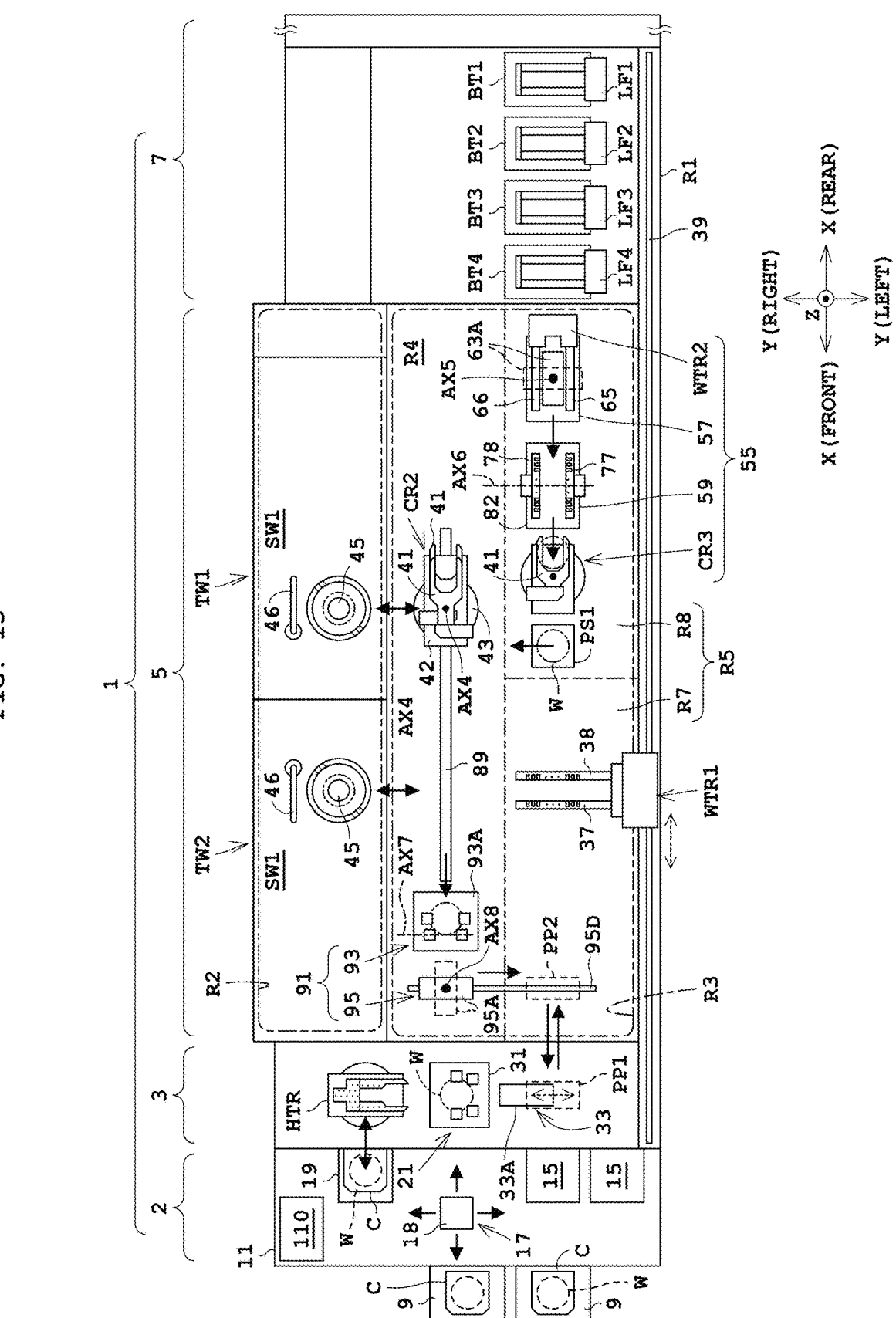
FIG. 13 is a plan view illustrating a schematic configuration of a substrate processing system according to a modification.

(4) In the embodiment and each of the modifications described above, the second orientation converting mechanism 55 may include a substrate transport robot CR3, as illustrated in FIG. 13, instead of the belt conveyor 61. In such a case, the substrate transport robot CR3 has the same configuration as that of the substrate transport robot CR1. That is, the substrate transport robot CR3 includes the movable hand 41 that holds one substrate W.

After the second orientation converting unit 59 converts the vertically oriented twenty-five substrates W to the horizontal orientation, the substrate transport robot CR3 causes the hand 41 to go into the space between the pair of chucks 77, 78 that are open, and takes out one substrate W from the pair of chucks 77, 78. The substrate transport robot CR3 then transports the one substrate W to a substrate holding area (substrate platform) PS1 on the front side. The substrate transport robot CR2 in the single-wafer substrate transport section R4 then takes the one substrate W from the substrate holding area PS1. The substrate transport robot CR3 may also transport the one substrate W directly to the substrate transport robot CR2 in the single-wafer substrate transport section R4, without using the substrate holding area PS1.

(5) In the embodiment and each of the modifications described above, the single-wafer substrate processing section R2 illustrated in FIG. 1 includes the substrate transport robot CR1, the first single-wafer processing chamber SW1, and the second single-wafer processing chambers SW2. In this regard, it is also possible for the single-wafer substrate processing section R2 to include the first single-wafer processing chamber SW1, as illustrated in FIG. 13, without including either the substrate transport robot CR1 or the second single-wafer processing chambers SW2.

In such a configuration, each of the rear tower TW1 and the front tower TW2 of the single-wafer substrate processing section R2 includes three first single-wafer processing chambers SW1. In each of the first single-wafer processing chambers SW1, one horizontally oriented substrate W is processed with the pure water and the IPA, and then spin-dried. The single-wafer substrate processing section R2 may include one or more first single-wafer processing chambers SW1.

Figure 14:
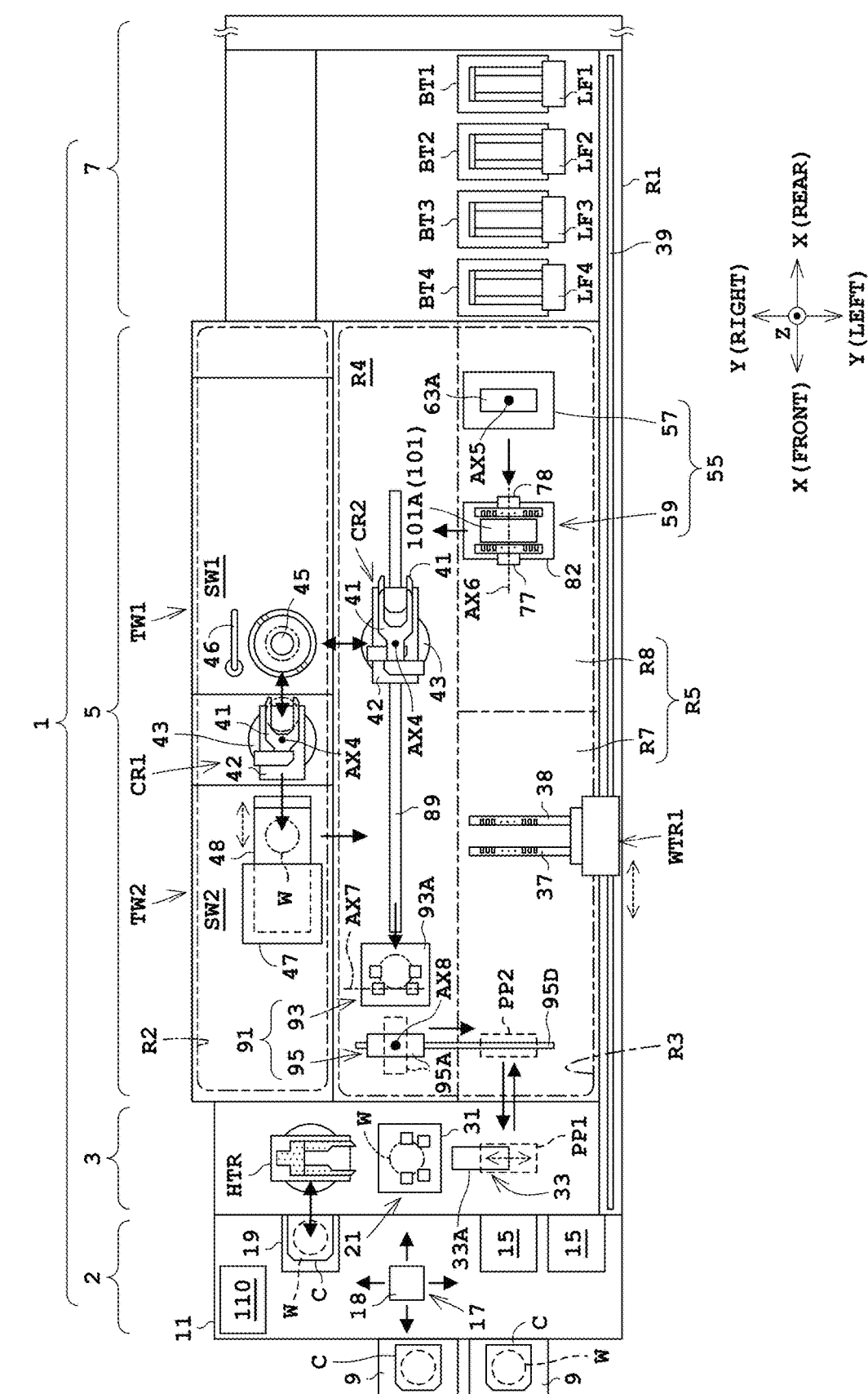
FIG. 14 is a plan view illustrating a schematic configuration of a substrate processing system according to a modification.

(6) In the embodiment and each of the modifications described above, as illustrated in FIG. 1, to convert the orientation of the plurality of substrates W to the horizontal orientation, the second orientation converting unit 59 rotates the plurality of substrates W about the horizontal axis AX6 extending in the width direction Y. In this regard, the second orientation converting unit 59 may rotate the plurality of substrates W about the horizontal axis AX6 extending in the front-back direction X, as illustrated in FIG. 14.

In such a case, the first batch transport mechanism WTR1 may transport the plurality of (e.g., twenty-five) substrates W to and from the first pusher 33A at the first substrate delivery position PP1, the second pusher 63A, the third pusher 95A at the second substrate delivery position PP2, the four batch process baths BT1 to BT4, and the second orientation converting unit 59. In addition, the second orientation converting unit 59 may receive the plurality of substrates W from the first batch transport mechanism WTR1 via the fourth pusher 101A included in the fourth pusher mechanism 101 illustrated in FIG. 12B.

After the second orientation converting unit 59 converts the plurality of vertically oriented substrates W to the horizontal orientation, the substrate transport robot CR2 may cause the first hand 41 to go into the space between the two chucks 77, 78 that are open, and cause the first hand 41 to take out one substrate W.

In the present modification, the first batch transport mechanism WTR1 may be enabled to select any one of the function of holding fifty substrates W (W1, W2), the function of holding twenty-five substrates W1 in the first substrate group, and the function of holding twenty-five substrates W2 in the second substrate group, as an example.

Figure 15:
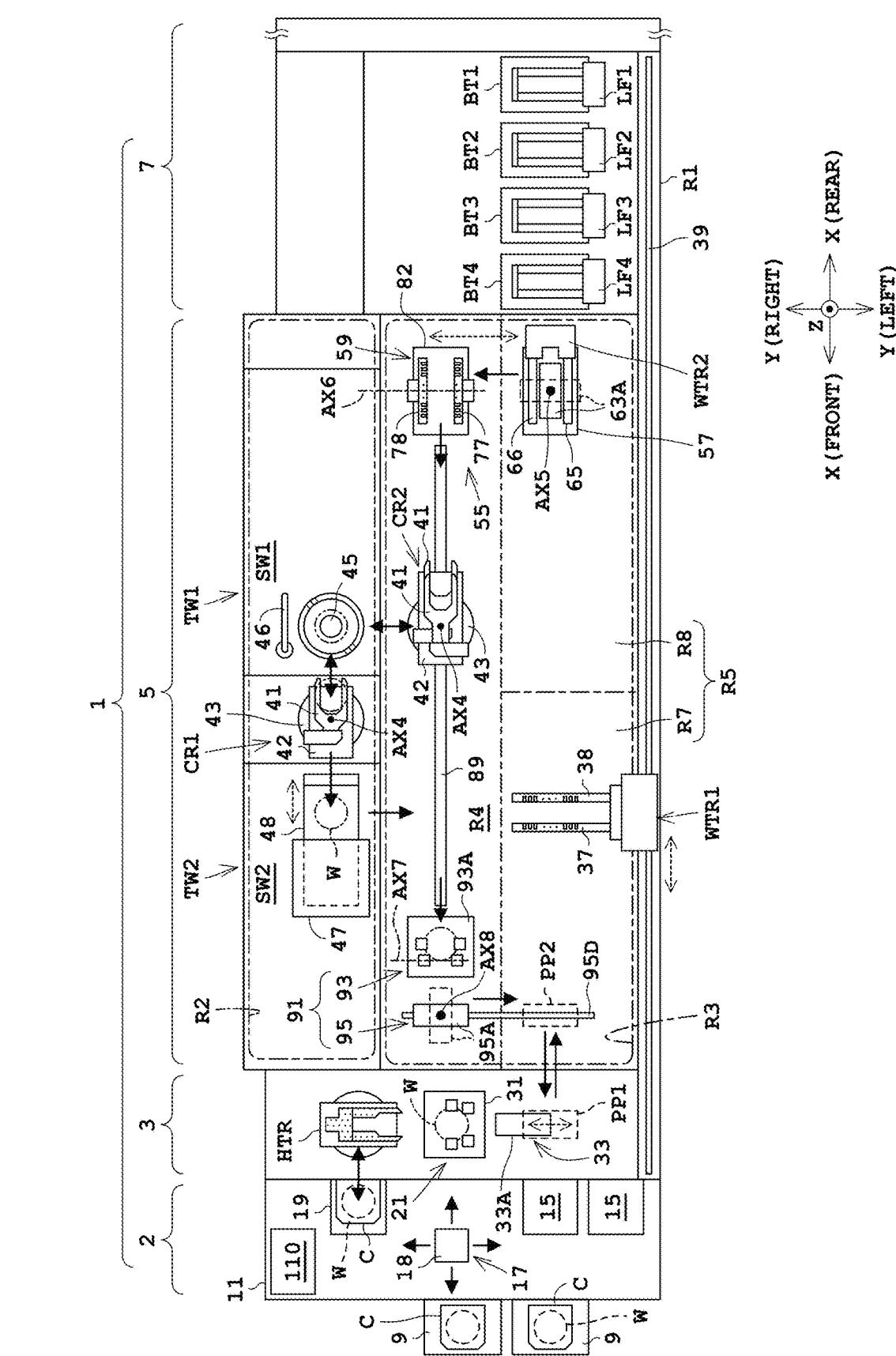
FIG. 15 is a plan view illustrating a schematic configuration of a substrate processing system according to a modification.

(7) In the embodiment and each of the modifications described above, the second orientation converting unit 59 is provided to the batch-processing-device-side section R8, and the standby bath 57 and the second orientation converting unit 59 are arranged in the front-back direction X. In this regard, the second orientation converting unit 59 may be provided to the single-wafer substrate transport section R4, as illustrated in FIG. 15. In other words, the second orientation converting unit 59 may be provided between the substrate transport robot CR2 and the batch processing device 7 in the single-wafer substrate transport section R4. The standby bath 57 is then provided in the batch-processing-device-side section R8. In FIG. 15, the standby bath 57 and the second orientation converting unit 59 are arranged along the width direction Y. To transport the plurality of substrates W from the standby bath 57 to the second orientation converting unit 59, the second batch transport mechanism WTR2 transports the plurality of substrates W in the width direction Y. The second orientation converting unit 59 then rotates the plurality of substrates W by 90 degrees in any direction about the horizontal axis AX6 that extends in the width direction Y.

Figure 16:
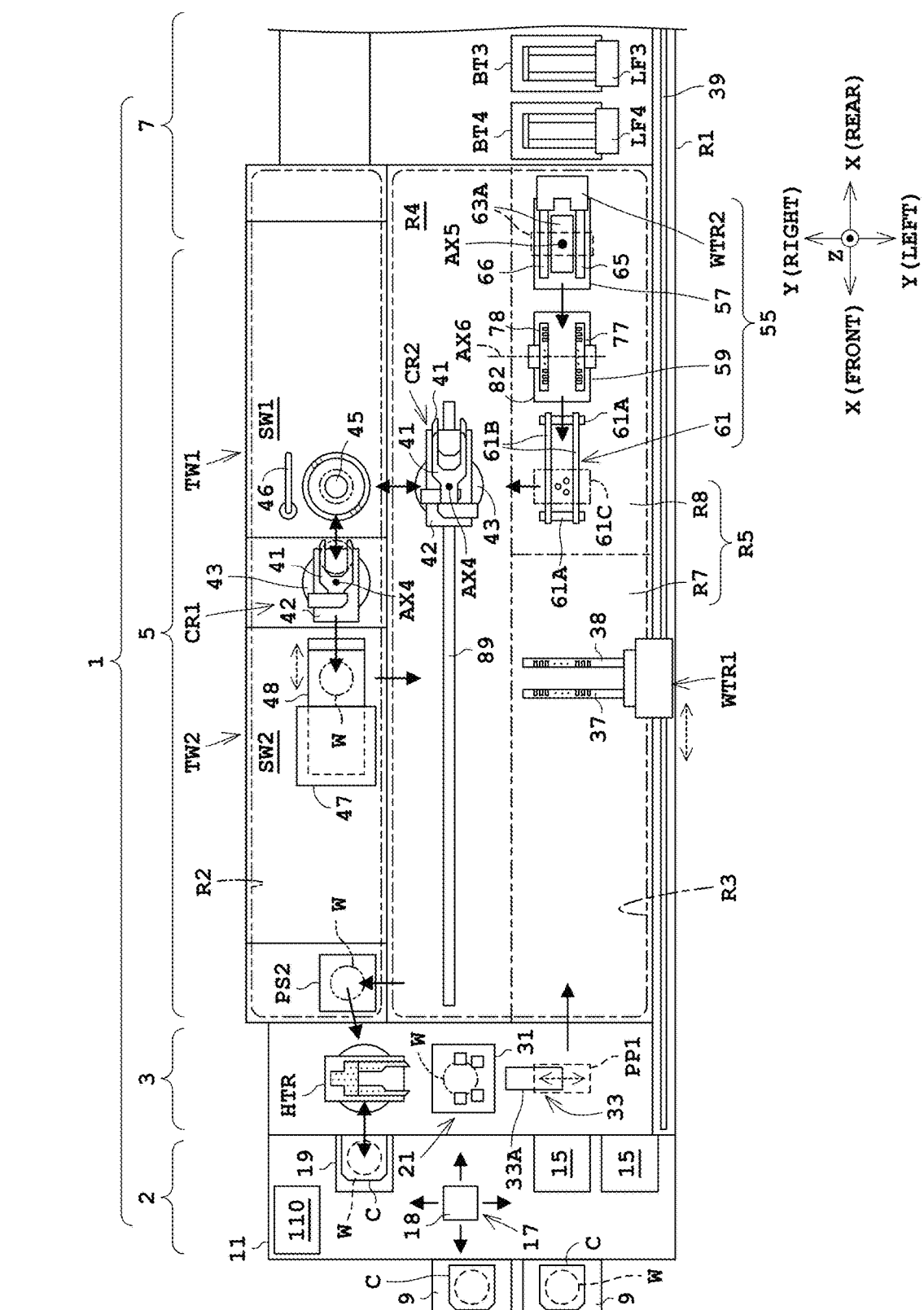
FIG. 16 is a plan view illustrating a schematic configuration of a substrate processing system according to a modification.

(8) In the embodiment and each of the modifications described above, the single-wafer processing device 5 includes the third orientation converting mechanism 91. In this regard, it is also possible for the single-wafer processing device 5 not include the third orientation converting mechanism 91, as illustrated in FIG. 16. In such a case, the single-wafer processing device 5 may include a substrate holding area (substrate platforms) PS2 on which twenty-five or more substrates W, for example, are placed within a range where the substrate handling mechanism HTR is accessible. The substrate holding area PS2 is positioned between the transfer device 3 and the front tower TW2, in the single-wafer substrate processing section R2.

The substrate transport robot CR2 receives one substrate W having been subjected to the drying processing, from the second single-wafer processing chamber SW2, and transports the substrate W to the substrate holding area PS2. When twenty-five substrates W are transported to the substrate holding area PS2, for example, the substrate handling mechanism HTR transports the twenty-five substrates W from the substrate holding area PS2 into the carrier C placed on the shelf 19.

Note that this modification not including the third orientation converting mechanism 91 has an effect of simplifying the operation of returning the substrate W to the carrier C. However, the single-wafer processing device 5 may become elongated in the front-back direction X. Furthermore, the substrate handling mechanism HTR accesses the substrate holding area PS2, in addition to the carrier C placed on the shelf 19 and the first orientation converting unit 31. Therefore, the transfer device 3 includes an operation program modified from that for the existing transfer device.

(9) In the embodiment and the modifications described above, the transfer device 3 includes the substrate handling mechanism HTR, the orientation converting unit 31, and the pusher 33A. In this regard, the transfer device 3 may include the substrate handling mechanism HTR and the pusher 33A, without including the orientation converting unit 31. In other words, the orientation converting unit 31 (the function of the orientation converting unit 31) may be included in the substrate handling mechanism HTR. Alternatively, the transfer device 3 may include the orientation converting unit 31 and the pusher 33A, without including the substrate handling mechanism HTR. In such a configuration, the substrate handling mechanism HTR (the function of the substrate handling mechanism HTR) may be included in the orientation converting unit 31.

In such a case, the substrate handling mechanism HTR (or the orientation converting unit 31) is configured as an articulated robot. The articulated robot takes out a plurality of (for example, five) substrates W from the carrier, and converts the plurality of horizontally oriented substrates W to the vertical orientation. The articulated robot then causes the pusher 33A to hold the plurality of vertically oriented substrates W.

(10) In the embodiment and each of the modification described above, the second orientation converting mechanism 55 includes the second batch transport mechanism WTR2, the second orientation converting unit 59, and the belt conveyor 61. In this regard, the second orientation converting mechanism 55 may include an articulated robot and a substrate holding area (substrate platform). In the batch-processing-device-side section R8, for example, the standby bath 57, the articulated robot, and the substrate holding area are arranged in the order listed herein toward the front.

The articulated robot then receives one substrate W from the second pusher 63A provided in the standby bath 57, and converts the one vertically oriented substrate W to the horizontal orientation. The articulated robot then transports the one horizontally oriented substrate W to the substrate holding area. The substrate transport robot CR2 in the single-wafer substrate transport section R4 then takes the one substrate W from the substrate holding area.

(11) In the embodiment and each of the modifications described above, the third orientation converting unit 93 may be a substrate holding area (substrate platform) and an articulated robot, for example. In the single-wafer substrate transport section R4, the substrate holding area is disposed between the substrate transport robot CR2 and the articulated robot. The substrate transport robot CR2 transports one substrate W having been subjected to the drying processing to the substrate holding area. The articulated robot takes the one substrate W from the substrate holding area, and converts the one horizontally oriented substrate W to the vertical orientation. The articulated robot then causes the third pusher 95A to hold the one vertically oriented substrate W.

(12) In the embodiment and each of the modifications described above, the substrate transport robot CR2 transports one horizontally oriented substrate W to and from the belt conveyor 61, the six single-wafer processing chambers (the first single-wafer processing chamber SW1 and the second single-wafer processing chambers SW2), and the third orientation converting unit 93. A plurality of substrate transport robots may be used to perform this process of transporting the substrate. Furthermore, two substrate transport robots may pass the one substrate W to each other directly. Furthermore, two substrate transport robots may pass the one substrate W via the substrate holding area (substrate platform).

(13) In the embodiment and each of the modifications described above, the hand 41 of at least one of the three substrate transport robots CR1 to CR3 may be moved by an articulated arm.

(14) In the embodiment and each of the modifications described above, for example, in the batch process bath BT1, fifty substrates W including twenty-five substrates W1 and twenty-five substrates W2 are arranged alternately are immersed at once. The fifty substrates W (W1, W2) are arranged at a half pitch (e.g., 5 mm). In this regard, a batch of the twenty-five substrates W arranged at a full pitch (for example, 10 mm) may be immersed into the batch process bath BT1 at once.

(15) In the embodiment and each of the modifications described above, in the batch process bath BT1, for example, the fifty substrates W forming a substrate processing group is immersed at once. Among these the fifty substrates W (W1, W2), the device surfaces of the twenty-five respective substrates W2 belonging to the second substrate group may face leftwards while the device surfaces of the twenty-five respective substrates W1 belonging to the first substrate group face rightwards. Furthermore, the device surfaces of the twenty-five respective substrates W2 belonging to the second substrate group may face the rightwards while the device surfaces of the twenty-five respective substrates W1 belonging to the first substrate group face rightwards.

(16) In the embodiment and each of the modifications described above, the batch substrate transport section R1 is not limited to the section disposed on the side (left side) of the single-wafer processing device 5, and may be configured to traverse above the single-wafer processing device 5.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate processing system that performs batch processing for processing a plurality of substrates at once, and performs single-wafer processing for processing a single substrate at a time, among the plurality of substrates, the substrate processing system comprising:

a transfer device including a carrier shelf on which a carrier is placed, the carrier being configured to store the plurality of substrates in a horizontal orientation, with a predetermined interval between the plurality of substrates;

a batch processing device that processes the plurality of substrates at once; and a single-wafer processing device that processes a single substrate at a time, among the plurality of substrates, wherein the transfer device, the single-wafer processing device, and the batch processing device are linearly arranged in a row in an order listed herein, the transfer device includes a first orientation converting unit that converts the plurality of substrates taken out from the carrier on the carrier shelf, from the horizontal orientation to a vertical orientation, the single-wafer processing device includes:

a plurality of single-wafer processing units that processes a single substrate at a time, among the plurality of substrates; and a first substrate transport mechanism that transports the plurality of substrates to the plurality of single-wafer processing units, the batch processing device includes:

a batch processing unit that processes the plurality of substrates at once; and a first batch transport mechanism that transports the plurality of substrates to the batch processing unit at once, and the first batch transport mechanism receives, on a side of the transfer device, the plurality of substrates having been converted by the first orientation converting unit to the vertical orientation, and transports the plurality of substrates directly to the batch processing unit without using the first substrate transport mechanism included in the single-wafer processing device.

2. The substrate processing system according to claim 1, wherein the batch processing device includes a batch substrate transport section that is a section where the first batch transport mechanism moves, the batch substrate transport section is positioned on one end side of the transfer device in a second horizontal direction orthogonal to a first horizontal direction in which the transfer device and the batch processing device are arranged, the batch substrate transport section extends from the transfer device to the batch processing unit in the batch processing device, the batch processing unit performs the batch processing on the plurality of substrates transported by the first batch transport mechanism, the first batch transport mechanism receives the plurality of substrates having been subjected to the batch processing, and transports the plurality of substrates that are in the vertical orientation to the single-wafer processing device, the single-wafer processing device performs the single-wafer processing on a single substrate at a time, among the plurality of substrates having been subjected to the batch processing, using the plurality of single-wafer processing units, and the transfer device transports the plurality of substrates having been transported from the single-wafer processing device and having been subjected to the single-wafer processing, to the carrier placed on the carrier shelf.

3. The substrate processing system according to claim 1, wherein the transfer device includes:

a substrate handling mechanism including a hand that takes out the plurality of substrates that are in the horizontal orientation, from the carrier having been placed on the carrier shelf;

the first orientation converting unit that converts the plurality of substrates that are in the horizontal orientation and transported by the substrate handling mechanism, to the vertical orientation; and a first vertical holder that holds the plurality of substrates received in the vertical orientation from the first orientation converting unit, and the first batch transport mechanism receives the plurality of substrates in the vertical orientation, from the first vertical holder.

4. The substrate processing system according to claim 2, wherein the single-wafer processing device includes an interface section extending in the first horizontal direction, the plurality of single-wafer processing units is provided on an opposite side of the batch substrate transport section across the interface section, the interface section includes a horizontal orientation converting mechanism that converts the plurality of substrates transported in the vertical orientation by the first batch transport mechanism to the horizontal orientation, and the first substrate transport mechanism transports the plurality of substrates in the horizontal orientation, from the horizontal orientation converting mechanism to the plurality of single-wafer processing units.

5. The substrate processing system according to claim 2, wherein the single-wafer processing device includes a passing section and a single-wafer substrate transport section both extending in the first horizontal direction, the batch substrate transport section, the passing section, and the single-wafer substrate transport section are arranged in an order listed herein in the second horizontal direction, the plurality of single-wafer processing units is arranged on an opposite side of the passing section across the single-wafer substrate transport section, the first substrate transport mechanism is provided to the single-wafer substrate transport section, the passing section includes:

a transfer-device-side section adjacent to the transfer device; and a batch-processing-device-side section adjacent to the transfer-device-side section and the batch processing device, the batch-processing-device-side section includes a horizontal orientation converting mechanism that converts the plurality of substrates transported in the vertical orientation by the first batch transport mechanism to the horizontal orientation, the horizontal orientation converting mechanism includes:

a second orientation converting unit that converts the plurality of substrates from the vertical orientation to the horizontal orientation; and a second substrate transport mechanism that is disposed on an opposite side of the batch processing device across the second orientation converting unit, and that transports a single substrate, among the plurality of substrates having been converted into the horizontal orientation, and the first substrate transport mechanism in the single-wafer substrate transport section receives the single substrate from the second substrate transport mechanism, and transports the single substrate to the plurality of single-wafer processing units.

6. The substrate processing system according to claim 5, wherein the single-wafer substrate transport section includes:

a third orientation converting unit disposed between the transfer device and the first substrate transport mechanism, the third orientation converting unit converting the plurality of substrates transported in the horizontal orientation by the first substrate transport mechanism to the vertical orientation; and a second vertical holder holding the plurality of substrates having been converted into the vertical orientation by the third orientation converting unit, in the vertical orientation, the first batch transport mechanism receives the plurality of substrates from the second vertical holder and transports the plurality of substrates in the vertical orientation to the transfer device, and the transfer device converts the plurality of substrates transported from the single-wafer processing device and having been subjected to the single-wafer processing, from the vertical orientation to the horizontal orientation, and transports the plurality of substrates having been converted into the horizontal orientation to the carrier placed on the carrier shelf.

7. The substrate processing system according to claim 5, wherein the horizontal orientation converting mechanism includes a standby bath disposed between the second orientation converting unit and the batch processing device, the standby bath storing an immersion liquid in which the plurality of substrates is immersed in the vertical orientation.

8. The substrate processing system according to claim 7, wherein the horizontal orientation converting mechanism includes a second batch transport mechanism having a pair of chucks including a plurality of pairs of holding grooves and a plurality of pairs of passing grooves that are alternately arranged, and when a substrate processing group including the plurality of substrates alternately arranged with another plurality of substrates is immersed in the immersion liquid in the standby bath, the second batch transport mechanism takes out the plurality of substrates from the substrate processing group using the pair of chucks, and transports the plurality of the substrates having been taken out to the second orientation converting unit.

9. The substrate processing system according to claim 1, wherein the first batch transport mechanism includes a pair of chucks that holds the plurality of substrates in the vertical orientation, and the first batch transport mechanism transports the plurality of substrates held in the vertical orientation by the pair of chucks.

10. The substrate processing system according to claim 1, wherein the batch processing unit is a batch process bath that stores a process liquid for immerging the plurality of substrates, and the plurality of single-wafer processing units is a plurality of single-wafer processing chambers.

\* \* \* \* \*